(12) United States Patent
Hilkene

(10) Patent No.: US 12,072,267 B2
(45) Date of Patent: Aug. 27, 2024

(54) METHOD AND HARDWARE FOR POST MAINTENANCE VACUUM RECOVERY SYSTEM

(71) Applicant: Applied Materials, Inc., Santa Clara, CA (US)

(72) Inventor: Martin A. Hilkene, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 383 days.

(21) Appl. No.: 17/459,545

(22) Filed: Aug. 27, 2021

(65) Prior Publication Data

US 2022/0065735 A1    Mar. 3, 2022

Related U.S. Application Data

(60) Provisional application No. 63/072,860, filed on Aug. 31, 2020.

(51) Int. Cl.
*G01M 3/34* (2006.01)
*G05B 15/02* (2006.01)
(Continued)

(52) U.S. Cl.
CPC .............. *G01M 3/34* (2013.01); *G05B 15/02* (2013.01); *C30B 25/16* (2013.01); *H01J 37/32972* (2013.01)

(58) Field of Classification Search
CPC .............. G01M 3/34; H01J 37/32834; H01J 37/32972; H01J 2237/18; H01J 49/0009;
(Continued)

(56) References Cited

U.S. PATENT DOCUMENTS 6,146,492 A * 11/2000 Cho .................. H01J 37/32935
156/345.24
7,043,966 B2 * 5/2006 Kuehn ................ G01M 3/3281
73/49.3

(Continued)

FOREIGN PATENT DOCUMENTS

| CN | 110017955 A | 7/2019 | |
| KR | 20160078910 A * | 7/2016 | ....... Y10T 137/8602 |
| WO | WO-0118845 A1 * | 3/2001 | ........... C07K 14/195 |

OTHER PUBLICATIONS

International Search Report and Written Opinion for International patent application No. PCT/US2021/048226 dated Dec. 21, 2021, 10 pages.

*Primary Examiner* — Jeffrey P Aiello
(74) *Attorney, Agent, or Firm* — Lowenstein Sandler LLP

(57) ABSTRACT

A method and system for vacuum chamber integrity verification after chamber maintenance or venting. The method includes a computing system causing a measurement cycle that includes causing a pump to pump down pressure of the vacuum chamber for a set duration of time or to a target pressure; causing an isolation valve to isolate the vacuum chamber; receiving sensor data from an optical emission sensor; and analyzing the sensor data to determine whether the sensor data satisfies one or more sensor data criteria. The method further includes, the computing system, causing one or more repetitions of the measurement cycle until the sensor data meets the one or more sensor data criteria. The method further includes analyzing the sensor data that meets the sensor data criteria to determine at least one of vacuum chamber leak rate or vacuum chamber moisture content. The system includes the vacuum chamber, pump, isolation valve, optical emission sensor, and computing system.

20 Claims, 10 Drawing Sheets

(51) Int. Cl.
*C30B 25/16* (2006.01)
*H01J 37/32* (2006.01)

(58) Field of Classification Search
CPC .. C30B 25/16; G05B 15/02; G05B 19/41875; G05B 19/4184; G05B 23/0221; G05B 23/0283; G05B 2219/45031; G06F 18/217; G06F 17/18
USPC .......... 73/40; 414/939, 935; 438/905, 5; 700/110, 108, 121, 109; 702/33, 50, 188, 702/19, 185, 51, 35, 184, 55, 138, 182, 702/189, 82
See application file for complete search history.

(56) References Cited

U.S. PATENT DOCUMENTS

| | | | |
|---|---|---|---|
| 7,765,853 B2* | 8/2010 | Safai | G01M 3/363 |
| | | | 73/40 |
| 2003/0010092 A1* | 1/2003 | Lu | G01M 3/3236 |
| | | | 73/40 |
| 2015/0211955 A1* | 7/2015 | Bounouar | G01M 3/202 |
| | | | 73/49.3 |
| 2017/0097273 A1* | 4/2017 | Yang | H01L 21/67288 |
| 2020/0176233 A1* | 6/2020 | Hsieh | H01J 37/32862 |

* cited by examiner

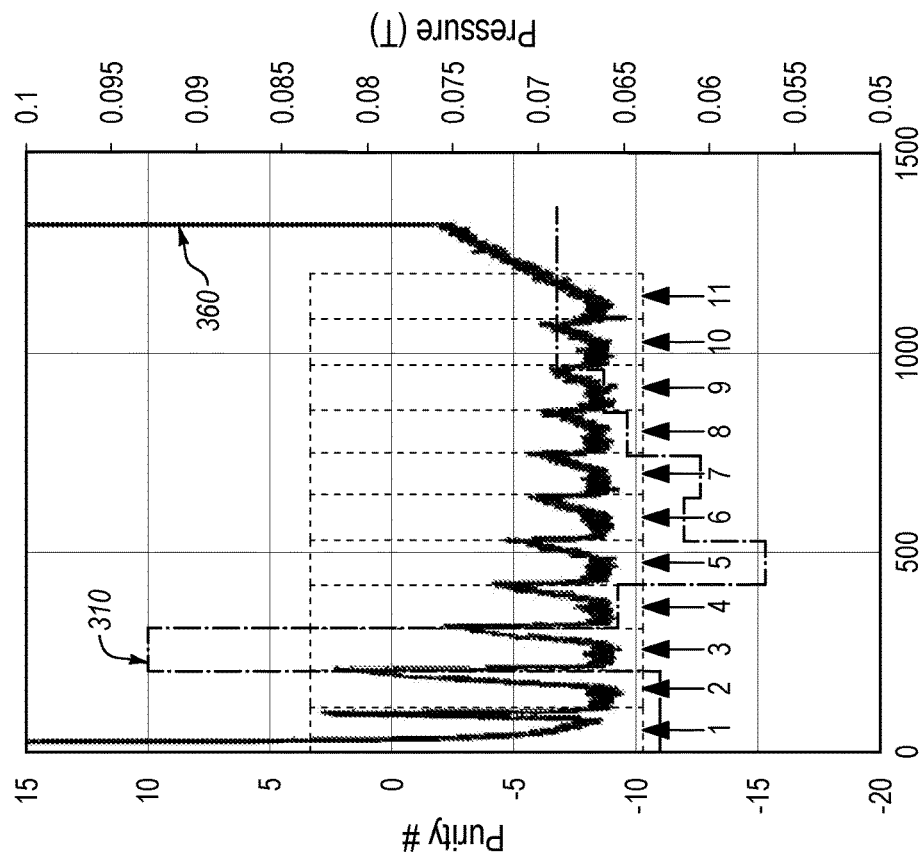
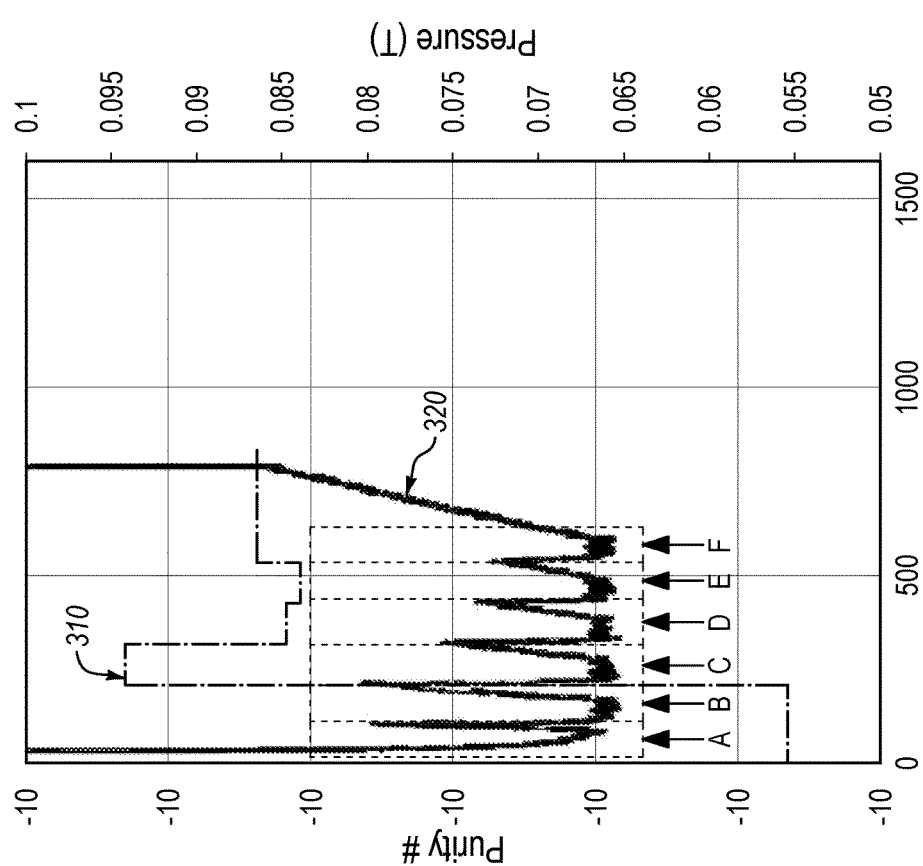
FIG. 3B
FIG. 3A

METHOD AND HARDWARE FOR POST MAINTENANCE VACUUM RECOVERY SYSTEM

RELATED APPLICATIONS

This patent application claims the benefit under 35 U.S.C. § 119(e) of U.S. Provisional Application No. 63/072,860, filed Aug. 31, 2020.

TECHNICAL FIELD

Some embodiments of the present disclosure relate, in general, to a method and hardware for a post maintenance vacuum recovery system. In particular, the present disclosure relates to a method and hardware for rapid in-situ verification of vacuum chamber leak integrity and/or moisture content after chamber maintenance or venting.

BACKGROUND

Semiconductor substrates are commonly processed in vacuum processing systems. These systems include one or more processing chambers, each performing substrate processing operations such as etching, chemical vapor deposition, or physical vapor deposition, which can include temperature and pressure cycling as well as introduction of a variety of chemical components into the chambers. The processing chambers undergo regular maintenance and the health of such processing chambers is regularly monitored.

For example, the pressure in the processing chambers can be monitored over time to verify the chamber's leak integrity based on the measured rate of pressure rise (ROR) in the chamber. Early detection of leaks can greatly improve the economic viability of a vacuum processing system.

Existing vacuum chamber leak integrity measurement devices tend to have disadvantages, such as, being cost prohibitive, being sensitive to high temperatures, having a short operating lifetime, and being bulky, to name a few. Due to these disadvantages and others, it is not feasible to apply them on every processing chamber.

Instead, many end users of vacuum chambers resort to pumping the vacuum chamber for an extended period (e.g., minutes to several hours, depending on chamber type), then isolating the vacuum chamber, and measuring the pressure increase over a period of time. This routine provides no feedback or indication of the vacuum chamber's leak integrity until the final measurement step that occurs after hours of pumping down to vacuum. If the vacuum chamber has a small vacuum leak, many hours can be spent pumping the pressure in the vacuum chamber down until the leak is discovered. This causes unnecessary system downtime and loss of production.

SUMMARY

Some embodiments described herein are directed to a method for verifying chamber leak integrity. The method includes causing, by a computing system, a measurement cycle. The measurement cycle includes causing a pump to pump down the pressure of a semiconductor processing chamber for a set duration of time. The measurement cycle further includes causing an isolation valve to isolate the semiconductor processing chamber. The method further includes receiving sensor date from an optical emission sensor. The measurement cycle further includes analyzing the sensor data to determine whether the sensor data satisfies one or more sensor data criteria. The method further includes causing, by the computing system, one or more repetitions of the measurement cycle until the sensor data meets the one or more sensor data criteria. The method further includes analyzing the sensor data that meets the sensor data criteria to determine a vacuum chamber leak rate.

Some embodiments described herein are directed to a for monitoring vacuum chamber moisture content. The method includes causing, by a computing system, a measurement cycle. The measurement cycles includes causing a pump to pump down pressure of a semiconductor processing chamber for a set duration of time. The measurement cycles further includes causing an isolation valve to isolate the semiconductor processing chamber. The measurement cycles further includes receiving hydrogen, oxygen, or hydroxyl related sensor data from an optical emission sensor. The measurement cycles further includes analyzing the hydrogen, oxygen, or hydroxyl sensor data to determine whether the hydrogen, oxygen, or hydroxyl sensor data satisfies one or more sensor data criteria. The method further includes causing, by the computing system, one or more repetitions of the measurement cycle until the hydrogen, oxygen, or hydroxyl sensor data meets the one or more sensor data criteria. The method further includes analyzing the hydrogen, oxygen, or hydroxyl sensor data that meets the one or more sensor data criteria to determine vacuum chamber moisture content.

Some embodiments described herein are directed to a system including a vacuum chamber, an optical emission sensor (e.g., for performing remote plasma optical emission spectroscopy (OES) and/or plasma enhanced OES), a pump, and a computing system. The vacuum chamber includes a body coupled to an isolation valve configured to isolate a cavity formed by the body. The optical emission sensor may be mounted above the isolation valve (e.g., on a chamber volume side of the isolation valve) and may be configured to generate sensor data corresponding to emission of one or more gases from the cavity. The pump may be coupled to the vacuum chamber and being configured to manipulate pressure in the vacuum chamber. The computing system may be configured to cause a measurement cycle. The measurement cycle may include causing the pump to pump down pressure of the vacuum chamber for a set duration of time and/or to a target pressure (e.g., of about 0.1 mTorr to about 500 mTorr, or greater than 10 mTorr); causing the isolation valve to isolate the vacuum chamber; receiving sensor data from the optical emission sensor; analyzing the sensor data to determine whether the sensor data satisfies one or more sensor data criteria. The computing system is further configured to cause one or more repetitions of the measurement cycle until the sensor data meets the one or more sensor data criteria. The computing system is further configured to analyze the sensor data that meets the sensor data criteria to determine at least one of vacuum chamber leak rate or vacuum chamber moisture content.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 3A illustrates a graphical output of an operational method, for determining vacuum chamber leak integrity, performed on a vacuum chamber with a leak, according to embodiments of the disclosure.

FIG. 3B illustrates a graphical output of an operational method, for determining vacuum chamber leak integrity, performed on a vacuum chamber without a leak, according to embodiments of the disclosure.

DETAILED DESCRIPTION OF EMBODIMENTS

Figure 1:
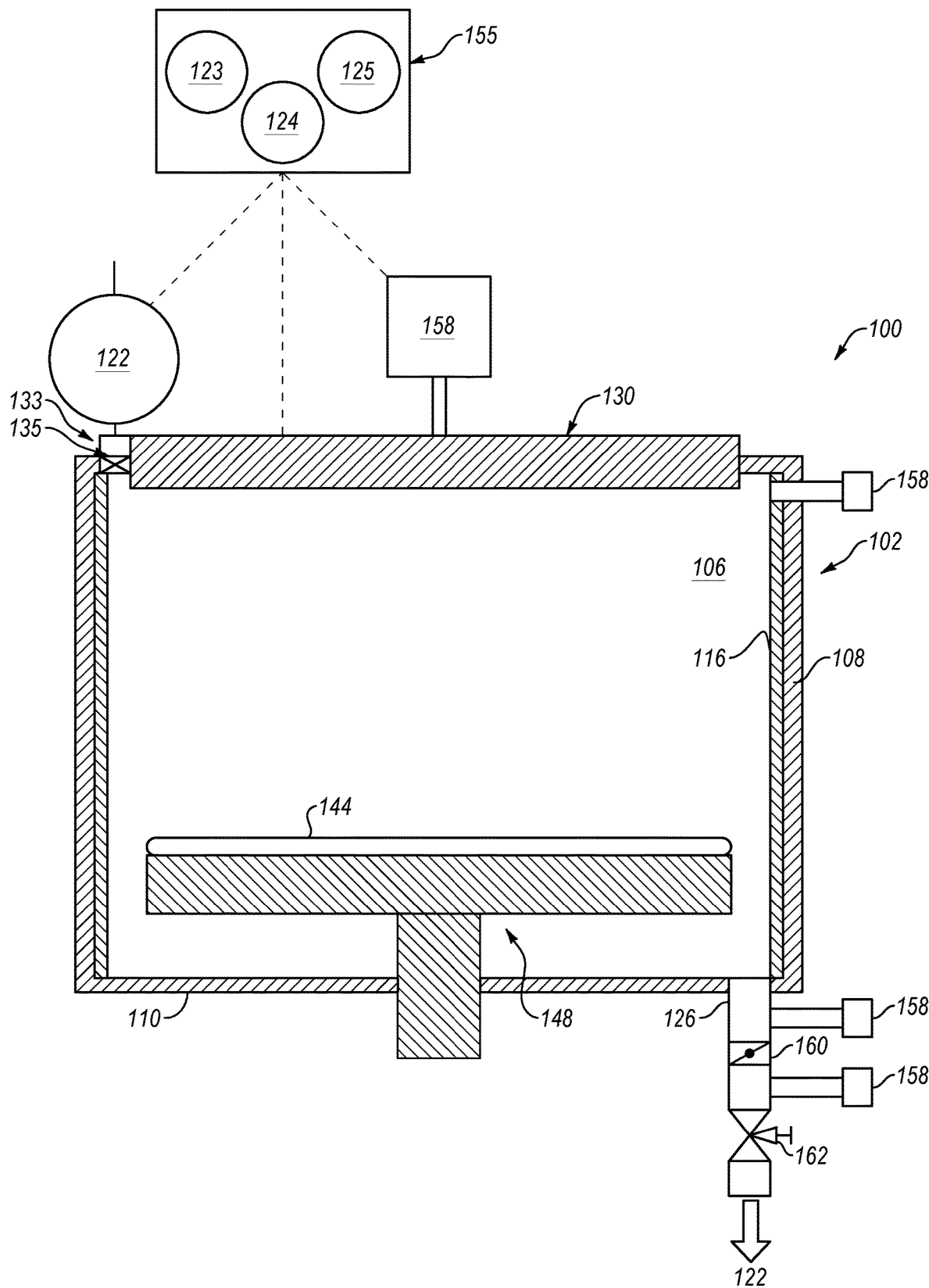
FIG. 1 illustrates a schematic of a system, according to embodiments of the disclosure.

Embodiments of the present disclosure are directed to a method and a system for rapid verification of vacuum chamber leak integrity after chamber maintenance or venting. In certain embodiments, the instant disclosure is directed to operational methods suitable to quickly verify if a vacuum chamber is leak tight (e.g., has no leaks or has a leak rate that is below a threshold) after maintenance or venting. The operational methods described herein allow standard chamber recovery routines to be avoided if a vacuum leak is detected or if a chamber leak rate passing specification is achieved using a rapid leak rate test as described herein. In certain embodiments, the operational methods described herein can additionally or alternatively be utilized to monitor moisture in a vacuum chamber, such as during pump down and bake out routines.

Standard chamber post maintenance (or venting) vacuum integrity checks (also may be referred to as "rate of rise" or "ROR" routines) involve: 1) pumping a chamber for a user defined period; 2) isolating the chamber and stabilizing the pressure; and 3) measuring pressure increase in the chamber over a user defined period. With such methods, pump times can be as long as minutes to several hours, depending on the chamber type. If a chamber has a small vacuum leak, many additional hours may then be spent measuring chamber pressure until a leak is detected. This contributes to unnecessary system downtime and loss of production.

Existing vacuum integrity measurement devices such as helium leak detectors and residual gas analyzers (RGA) have many disadvantages including: being too cost prohibitive to be utilized on every chamber, being too bulky for use in some chambers, having a low sensitivity, having a short lifetime, having limitations on measurement conditions (such as a limitation on the chamber temperature or a limitation on chemistries that may be used in a process chamber), and the like. For example, $ZrO_2$ oxygen sensors may only work in inert ambient environments. Additionally, some chambers have to be cooled down in order to obtain accurate leak information, which takes time. Moreover, systems may call for requalification after performance of such leak detection operations, which further increases equipment downtime. As an alternative to using such devices, many end users of vacuum chambers conduct the vacuum chamber integrity check by pumping the chamber for an extended period (e.g., hours), then isolating the chamber and measuring a pressure increase over time. With this routine, there is no in-situ, real time feedback or indication of a leak until the final pressure increase measurement is completed.

In contrast, the operational methods and systems of the instant disclosure give active, in-situ, real time feedback during chamber pump down, which can be used to quickly (e.g., within seconds minutes) determine whether a chamber has a vacuum leak. For example, leak detection may be performed in under 60 seconds in embodiments. Additionally, the methods and systems of the present disclosure can be performed on hot chambers (e.g., chambers above room temperature, such as at 100° C., 120° C., 150° C., 180° C., 200° C., 400° C., and so on). Additionally, the methods and systems of the present disclosure are not affected by chemical byproducts (such as inert and/or toxic byproducts) outgassing from a chamber. The methods and systems described herein reduce system maintenance time by reducing pumping times used to verify chamber leak rate and/or to reduce background moisture. For example, the time to check for a vacuum leak can be reduced from hours to minutes. The operational methods and systems described herein are more cost effective than traditional techniques and systems, making them more viable and likely to be utilized on a large number of chambers. The operational methods and systems described herein can be used on hot chambers, can be used to fingerprint vacuum chamber health, and can be used with a short service routine to verify vacuum integrity periodically during a chamber production cycle without shutting down or cooling down the chamber.

The term "in-situ" herein means "in place" in the sense that the processing chamber remains intact and the processing chamber need not be disassembled or exposed to atmosphere in order to carry out the disclosed operational methods. In-situ methods may be performed between processing of substrates or even as a step in a process of a chamber.

In certain embodiments, described here is a system that includes a vacuum chamber (e.g., semiconductor processing chamber). The vacuum chamber may include one or more inputs that permit gases to flow into the chamber and/or one or more outputs that permit gases to flow out of the chamber. One or more of the outputs may be connected to a vacuum pump. Any of these inputs and/or outputs may include an isolation valve that can be closed to isolate an interior of the vacuum chamber.

In embodiments, the vacuum chamber is coupled to a pump (e.g., a rotary pump with a blower, a cryo pump, a turbo pump and the like) configured to adjust the pressure within the vacuum chamber. An optical emission device (e.g., a low cost remote plasma optical emission device, also may be referred to as "OES") is mounted onto the vacuum chamber, e.g., above the isolation valve, or a gas line connected to the vacuum chamber. An isolation valve may be placed between the OES and the process chamber to prevent exposure to process gases during regular processing in the chamber. Such isolation may be used, for example, on deposition chambers such as those used for epitaxy deposition (EPI). The OES may or may not have an on-board vacuum measurement capability. The OES may be used, optionally in combination with the existing vacuum chamber vacuum gauge, to periodically monitor the optical intensity of one or more gases found in the vacuum chamber after the chamber has been vented. The OES (e.g., along with a vacuum gauge) may also be used to monitor the pressure increase in the vacuum chamber during the vacuum chamber isolation and measurement operations.

In certain embodiments, also described herein, is a method of detecting a leak rate for a vacuum chamber. The method includes performing a series of measurement cycles, caused by a computing system. The measurement cycle includes the computing system causing a short pump down operation for a first duration, causing a chamber isolation, and causing collection of OES sensor data and vacuum gauge readings for a second duration. The computing system causes repetition of the measurement cycle until OES sensor data meets specified sensor data criteria. The OES sensor data, such as optical emission line trend, optical sensor integration time, and vacuum increase, as measured for one or more gases found in the vacuum chamber after venting, may be used to monitor the reduction in outgassing of one or more of these gases as well as to monitor hydrogen and hydroxyl from water during vacuum chamber recovery. A slope of an increase in the emission line trend may be calculated, which may be reported as a numeric value (e.g., a purity number), which may have an arbitrary unit of measurement.

The OES sensor data may include data for one or more emission lines. If a vacuum leak is present, the emission lines for one or more gases (e.g., for oxygen, nitrogen, and/or argon) will stabilize at an elevated level. The above described measurement cycle may be repeated until the sensor data has stabilized for a number of measurements cycles in a row that is at least equal a measurement cycle number threshold. Whether the sensor data has stabilized may be verified by comparing a first sensor data obtained from the most recent measurement cycle to one or more previous sensor data values obtained from one or more previous measurement cycles and determining whether the difference is below a difference threshold. Upon determination that the difference between first sensor data and one or more previous sensor data is less than a difference threshold for a number of measurement cycles that at least equals the measurement cycle number threshold, the measurement cycles may be end-pointed (e.g., no additional measurement cycles may be run), and the background level of one or more gases can be determined. The background level or sensor data for the one or more gases can then be analyzed (e.g., compared to a calibrated baseline) to determine whether the vacuum chamber is leak tight and/or to determine the vacuum chamber leak rate. A calibrated leak or any method of bleeding a trace gas flow (e.g., trace air or oxygen flow) in the chamber may be used to calibrate the device.

FIG. 1 illustrates a schematic of a system 100, according to embodiments of the disclosure. In certain embodiments, the system 100 includes a processing chamber 102 (e.g., a semiconductor processing chamber) or another vacuum chamber. The processing chamber 102 includes a chamber body 108 (including side walls 116 and bottom wall 110) coupled to a lid 130 disposed thereon. The chamber body 108 and the lid 130 together define an inner volume or inner cavity 106. A substrate support assembly 148 is disposed within the inner volume 106 to support a substrate 144 thereon during processing.

A pipe or channel (e.g., an inlet our outlet) 133 connects a vacuum pump 122 to the interior 106 of the chamber 100. An isolation valve 135 may be included in the channel 133, and may be closed to isolate the interior 106 from an external environment.

An optical emission sensor (OES) 158 may further be mounted in or to the chamber 100. In one embodiment, the OES is mounted over a viewport in the isolation valve 135. Alternatively, the OES 158 may be mounted over a viewport at any other location of the chamber 100 in a manner that enables the OES to take optical measurements of the interior 106. In one embodiment, the OES 158 is located at a side of the processing chamber 102. In one embodiment, the OES 158 is located off of an exhaust port or exhaust line or fore line before an isolation valve 160. In one embodiment, the OES 158 is located off of the exhaust line or fore line between a pressure control valve 160 and an isolation valve 162. The optical emission sensor 158 may be a remote plasma optical emission sensor. The optical emission sensor is configured to generate sensor data corresponding to emission of one or more gases from the inner volume or inner cavity 106. The optical emission sensor 158 may or may not have an on-board vacuum measurement capability. The optical emission sensor 158 may be utilized in combination with a built-in vacuum gauge of the semiconductor processing chamber 102 (not shown) in embodiments. In certain embodiments, the optical emission sensor 158 may be independently isolated from the process chamber 102 during wafer processing. This may be beneficial in harsh depositing chemistries, such as epi, as it may protect the gauge when the depositing chemistries are flowing.

In one embodiment, the optical emission sensor 158 includes a sensor manifold and a sensor coupled to the sensor manifold. An assistant gas supply may be coupled to the sensor manifold and may be configured to supply an assistant gas to the sensor manifold. The sensor manifold may be configured to be coupled to a vacuum chamber fore line. An exemplary suitable optical emission sensor is described in U.S. Pat. No. 10,502,651, which is incorporated herein by reference in its entirety. In some embodiments, the OES may have any combination of the features described in Table 1 below.

TABLE 1

Specification for an Exemplary Optical Emission Sensor According to an Embodiment

| Specifications | | Units | Range |
|---|---|---|---|
| $N_2$ measurement range | | mbar (Torr) | $1 \times 10^{-6}$ to 10 ($7.6 \times 10^{-7}$ to 7.6) |
| $O_2$ leak detection limit | | mTorr/min | $\geq 0.3$ |
| Pressure (inert gases < 50° C.) | | bar (absolute) | $\leq 10$ |
| Operation temperature | | ° C. | 5 to 60 |
| Storage temperature | | ° C. | −20 to 70 |
| Bakeout at flange | | ° C. | $\leq 80$ |
| Relative humidity for 30 days a year | | % | $\leq 95$ (non-condensing) |
| Supply Voltage | At gauge | V (dc) | +14.5 to +30 |
| | Ripple | V (p-p) | $\leq 1$ |
| | Power consumption | W | $\leq 5$ |
| | Fuse to be connected | AT | $\leq 1$ |
| Output Signal | Digital | | Ethercat, Dnet, or other communication protocol |
| | Sensor input | | Start/Stop, Plasma on/off, set integration time |
| | Sensor output | | emission line slope, gas composition |
| Electrical connection | | | D-sub, 9 pin (male) |
| High voltage (in the measuring chamber) | Ignition voltage | kV | $\leq 4.5$ |
| | Operating voltage | kV | $\leq 3.3$ |
| Ignition behavior | $1 \times 10^{-5}$ to 10 | Sec | $\leq 1$ |
| | $1 \times 10^{-6}$ to $10^{-5}$ | Sec | $\leq 20$ |
| Materials exposed to vacuum | General | | Al2O3, stainless steel 1.4435 |
| | Anode | | Molybdenum |
| | Ionization chamber | | Titanium, stainless steel 1.4016 |
| | Ignition aid | | Stainless steel 1.4310 |
| Vacuum flange | | | 8 VCR, 4VCR, KF25, KF40, or other standard vacuum fitting |
| Internal volume | | $cm^3$ ($inch^3$) | $\leq 30$ (1.83) |
| Weight | | g | $\leq 800$ |
| Dimensions | Footprint | mm | 60 × 60 |
| | Height | mm | 137 |

The pressure within the inner volume or inner cavity 106 of the process chamber 102 may be controlled, adjusted, or manipulated using an exhaust valve or isolation valve 162 and/or pressure valve 160 on an exhaust line or fore line 126 and/or one or more vacuum pump 122, which are coupled to the process chamber 102. A vacuum pump 122 may be one of a variety of pumps, such as, without limitations, a rotary pump with a blower on top, a cryo pump, a turbo pump, and the like. The temperature of the chamber body 102 may be controlled, adjusted, or manipulated using liquid-containing conduits (not shown) that run through the chamber body 108 and/or through built-in heaters in certain chamber components (such as in the substrate support assembly 148). In some embodiments, vacuum pump 122 is connected to the isolation valve 162 via a pipe or channel.

The semiconductor processing chamber 102 and various components thereof are further coupled to a controller 155 that is configured to control the operation of the semiconductor processing chamber 102 and various components thereof before, during, and after processing. The controller 155 may be and/or include a computing system such as a personal computer, a server computer, a programmable logic controller (PLC), a microcontroller, and so on. The controller 155 may include one or more processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. In certain embodiments reference to a controller and to a computing system may be used interchangeably.

Although not illustrated, the controller 155 may include a data storage device (e.g., one or more disk drives and/or solid state drives), a main memory, a static memory, a network interface, and/or other components. The controller 155 may execute instructions to perform any one or more of the methodologies and/or embodiments described herein, including image or sensor data processing and analysis, sensor data processing algorithm, machine learning (ML) algorithms that generate and/or implement one or more trained machine learning model, deep ML algorithms, and other algorithms for analyzing sensor data in determining, for example, vacuum chamber leak integrity and/or moisture content within the processing chambers 102. The instructions may be stored on a computer readable storage medium, which may include the main memory, static memory, secondary storage and/or processing device (during execution of the instructions). In some embodiments, training data to train a ML model may be obtained by using a sensor or other type of devices on chambers with calibrated leaks.

The controller (e.g., computing system) 155 comprises a central processing unit (CPU) 123, a memory 124, and support circuits 125 for the CPU 123 and facilitates control of the components of the process chamber 102. The controller (e.g., computing system) 155 may be one of any form of general-purpose computer processor that can be used in an industrial setting for controlling various chambers and sub-processors. The memory 124 stores software (source or object code) that may be executed or invoked to control the operation of the process chamber 102 in the manner described herein.

The controller (e.g., computing system) 155 is also configured to monitor the health of the processing chamber 102 by, e.g., verifying the leak integrity and/or moisture content inside vacuum chamber body 102 after chamber maintenance and/or after venting. In certain embodiments, controller (e.g., computing system) 155 attains rapid verification of vacuum chamber leak integrity and/or moisture content by being configured to cause a measurement cycle and to cause one or more repetitions of said measurements cycle until sensor data obtained in the one or more measurement cycles meets one or more sensor data criteria, which will be described in further detail below with respect to the operational methods illustrated in FIG. 2 and FIG. 3.

The measurement cycle includes the controller (e.g., computing system) 155 being configured to cause the pump 122 to pump down pressure of the vacuum chamber 102 for a set duration of time. The measurement cycle further includes the controller (e.g., computing system) 155 being configured to cause the isolation valve 135 to isolate vacuum chamber 102. The measurement cycle further includes the controller (e.g., computing system) 155 being configured to receive sensor data from the optical emission sensor 158. The measurement cycle further includes the controller (e.g., computing system) 155 being configured to analyze the sensor data to determine whether the sensor data satisfies one or more sensor data criteria, which will be described in further detail below with respect to the operational methods illustrated in FIG. 2 and FIG. 3.

The controller (e.g., computing system) 155 is further configured to end the repetition of measurement cycles upon determining that the sensor data obtained in one or more measurement cycles meets one or more sensor data criteria. Thereafter, the controller (e.g., computing system) 155 is configured to analyze the sensor data that meets the sensor data criteria to determine at least one of vacuum chamber 102 leak integrity or vacuum chamber 102 moisture content.

The processing chambers 102 may be selected from one or more of: etch chambers, deposition chambers (including atomic layer deposition, chemical vapor deposition, physical vapor deposition, epitaxy, or plasma enhanced versions thereof), anneal chambers, implant chambers, and the like. Processing chambers 102 and the components therein may undergo regular maintenance and their health (such as vacuum leak integrity) may be regularly monitored. Similarly, in processing chambers that are sensitive to water (e.g., atomic layer deposition chambers), the moisture content in the chambers may also be regularly monitored.

Presently, monitoring the health of such processing chambers involves a lengthy process and/or cost prohibiting equipment that is bulky, has low sensitivity, short lifetime, and other disadvantages that reduce its usefulness. Additionally, some sensors are incompatible with process byproducts. Moreover, conventional leak detectors are inaccurate when used at elevated temperatures (e.g., temperatures above room temperature or near process temperatures). Lengthy processes may contribute to long system downtime and loss of production. To mitigate these losses, operators may assess the health of processing chambers less frequently and continue processing at a risk. System 100 is configured to provide in-situ rapid feedback about the health of processing chamber 102 with the use of affordable, compact, durable, accurate, and sensitive equipment (e.g., remote plasma optical emission sensor).

Figure 2:
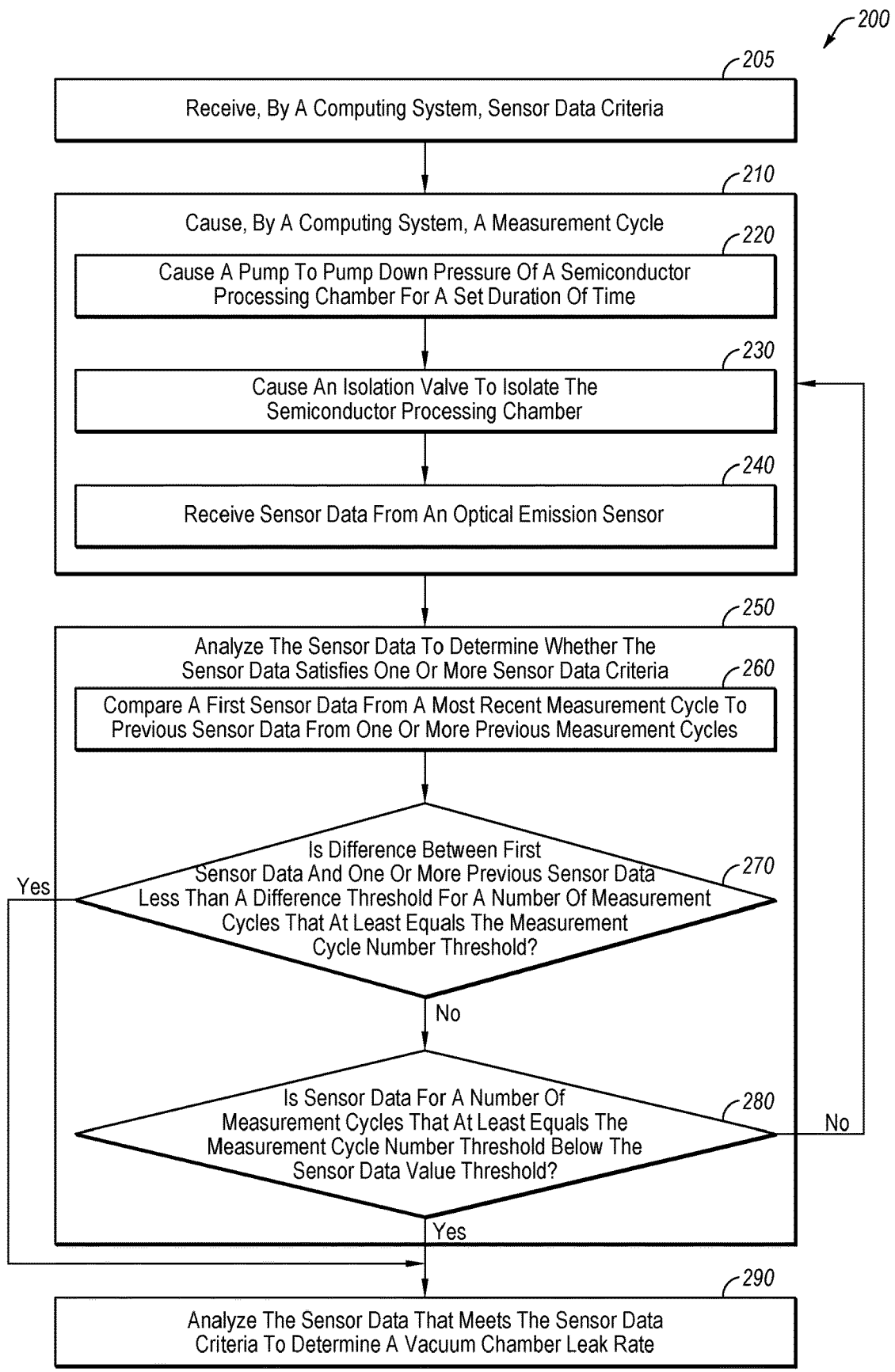
FIG. 2 illustrates a flow chart of an operational method of a computing system to determine vacuum chamber leak integrity, according embodiments of the disclosure.

FIG. 2 is a flow chart of an operational method 200 for determining vacuum chamber leak integrity of a processing chamber such as processing chamber 102 of FIG. 1, according to embodiments of the disclosure. Some operations of method 200 may be performed by processing logic that may include hardware (circuitry, dedicated logic, etc.), software (such as is run on a general purpose computer system or a dedicated machine), firmware, or some combination thereof. Some operations of method 200 may be performed by a computing system, such as the controller 155 of FIG. 1, that is in control of various components of processing chamber 102, such as pump 122, isolation valve 135, and/or optical emission sensor 158. For example, processing logic that performs one or more operations of method 200 may execute on the controller (e.g., computing system) 155.

For simplicity of explanation, the methods are depicted and described as a series of acts. However, acts in accordance with this disclosure can occur in various orders and/or concurrently, and with other acts not presented and described herein. Furthermore, not all illustrated acts may be performed to implement the methods in accordance with the disclosed subject matter. In addition, those skilled in the art will understand and appreciate that the methods could alternatively be represented as a series of interrelated states via a state diagram or events.

With reference to FIG. 2, the method 200 may begin with the computing system receiving sensor data criteria (205). Exemplary sensor data criteria that may be received by the computing system includes at least one of a difference threshold, a measurement cycle number threshold, and a sensor data value threshold. Each of these sensor data criteria will be described in further detail below with reference to various operations of method 200.

The method 200 may continue with the computing system causing a measurement cycle to occur (210). In each measurement cycle, the computing system causes a pump (such as pump 122 in FIG. 1) to pump down the pressure of a vacuum chamber (such as semiconductor processing chamber 102 in FIG. 1) for a set duration of time (220). Unlike with existing methods, where operators may pump down the pressure of the vacuum chamber for an extended duration that can sometimes take hours (e.g., until a certain pressure is achieved), the pumping operation of method 200 is short in duration and can span for a first duration ranging from about 10 seconds to about 10 minutes, from about 30 seconds to about 7 minutes, or from about 1 minute to about 5 minutes.

The method 200, and particularly the measurement cycle, continues with the computing system causing an isolation valve (such as isolation valve 135 or 162 in FIG. 1) to isolate the internal cavity (e.g., 106 in FIG. 1) of the vacuum chamber (230). The isolation operation of method 200 is also short in duration and can span for a second duration ranging from less than 5 seconds to a minute, from about 10 seconds to about 3 minutes, from about 20 seconds to about 2 minutes, or from about 30 seconds to about 90 seconds. In some embodiments, processing logic waits a short stabilization time after the isolation valve is closed before measurement begins. The stabilization time may be between about 1 and 300 seconds, or about 5 and 60 seconds in embodiments.

The method 200, and particularly the measurement cycle, continues with the computing system receiving sensor data from an optical emission sensor (e.g., remote plasma optical emission sensor 158 in FIG. 1). The sensor data that is received from the optical emission sensor correlates to the rate of pressure rise in the vacuum chamber (e.g., in the semiconductor processing chamber) and can provide information about the vacuum chamber's leak integrity and/or vacuum chamber's moisture content.

The sensor data that is received from the optical emission sensor may include at least one of vacuum chamber pressure (e.g., semiconductor processing chamber pressure), a measure of counts per second for one or more gases (e.g., normalized to counts per million and/or shown as percentages for each gas that are monitoring), partial pressure of one or more gases in the vacuum chamber (e.g., in the semiconductor processing chamber), composition of atmosphere in the vacuum chamber (e.g., in the semiconductor processing chamber), a purity number for one or more gases in the vacuum chamber (e.g., in the semiconductor processing chamber), optical sensor integration time for one or more gases in the vacuum chamber (e.g., in the semiconductor processing chamber), rate of pressure rise of one or more gases in the vacuum chamber (e.g., in the semiconductor processing chamber), optical emissions measurements, or a combination thereof.

The one or more gases that the optical emission sensor may provide sensor data for may be selected from nitrogen (N), oxygen (O), hydrogen (H), argon (Ar), or hydroxyl (OH) in embodiments. The optical emission sensor may provide sensor data for one or more of the above gases at varying wavelength, such as, from about 200 nm wavelength to about 900 nm wavelength.

The sensor data that is received by the computing system from the optical emission sensor may take different forms, some of which are explained in further detail below.

For example, the sensor data may be provided as optical emission intensity (measured as counts per second) as a function of wavelength for a particular measurement cycle. Each wavelength may correspond to a particular gas (e.g., a peak at a wavelength of 656 nm may correspond to hydrogen (H) and a peak at a wavelength of 777 nm or at a wavelength of 844 nm may correspond to oxygen (O)). The optical emission intensity at each wavelength may be correlated to the rate of partial pressure rise of a particular gas in the vacuum chamber.

In another example, the sensor data may be provided as a purity number for a particular measurement cycle and for a particular gas. The purity number may be an arbitrary number ranging, e.g., from 0 to about 300, that can be correlated to the rate of partial pressure rise of a particular gas in the vacuum chamber during the measurement cycle. The purity number will vary based on different chamber leak rates and different gas spectrums.

In yet another example, the sensor data may be provided as a purity integration time for a particular measurement cycle and for a particular wavelength (or for a particular gas since each wave length may correspond to a particular gas as explained above). The purity integration time reflects the time the optical emission sensor spends integrating a peak at a selected wavelength. The higher the intensity of the peak at a particular wavelength, the shorter the purity integration time is. The lower the intensity of the peak at a particular wavelength, the longer the purity integration time is. Longer purity integration time equates to a lower partial pressure.

The method 200, and particularly the measurement cycle, continues by the computing system analyzing the sensor data to determine whether the sensor data satisfies one or more sensor data criteria (250). This determination may occur by the computing system comparing a first sensor data from a most recent measurement cycle to a previous sensor data from one or more previous measurement cycles (260).

If method 200, as part of the measurement cycle, determines that the difference between the first sensor data and previous sensor data from one or more previous measurement cycles is less than a difference threshold for a number of measurement cycles that at least equals the measurement cycle number threshold (270), the method 200 determines that the sensor data has stabilized, may end repetition of the measurement cycles, and continue to the next operation (290). The sensor data stabilizing indicates that the background level of the one or more gasses that is being monitored is not changing.

If, however, method 200, as part of the measurement cycle, determines that the difference between the first sensor data and the previous data is higher than the difference threshold or is less than a difference threshold for a number of measurement cycles that is lower than the measurement cycle number threshold, the method 200 may continue to operation 280 to determine whether the sensor data satisfies one or more sensor data criteria from a different aspect.

If method 200, as part of the measurement cycle, determines that the sensor data for a number of measurement cycles that at least equals the measurement cycle number threshold has been below the sensor data value threshold (280), the method 200 may end repetition of the measurement cycles and continue to the next operation (290). If, however, method 200, as part of the measurement cycle, determines that the difference between the first sensor data and the previous data is higher than the sensor data value threshold or is below the sensor data value threshold for number of measurement cycles that is lower than the measurement cycle number threshold, the method 200 may repeat the measurement cycle (e.g., operations 210, 220, 230, 240, 250, 260, 270, and 280).

In one embodiment, a trained machine learning model is used to determine whether the sensor data meets the one or more sensor data criteria. The sensor data may be input into the trained machine learning model, which may then output a classification for the sensor data. The classification may be a first classification indicating that the one or more sensor data criteria are satisfied or a second classification indicating that the one or more sensor data criteria are not satisfied. In one embodiment, sensor data from multiple measurement cycles is input into the trained machine learning model. For example, sensor data from three measurement cycles may be input into the trained machine learning model.

The trained machine learning model may have been trained using a training dataset including a large number of data items, where each data item included a label indicating that the data item either did or did not satisfy the one or more sensor data criteria.

The trained machine learning model may be, for example, a decision tree, a neural network such as a convolutional neural network, a deep neural network, or other type of machine learning model. One type of machine learning model that may be used for determining whether the sensor data satisfies sensor data criteria is an artificial neural network, such as a deep neural network. Artificial neural networks generally include a feature representation component with a classifier or regression layers that map features to a target output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g.

classification outputs). Deep learning is a class of machine learning algorithms that use a cascade of multiple layers of nonlinear processing units for feature extraction and transformation. Each successive layer uses the output from the previous layer as input.

Deep neural networks may learn in a supervised (e.g., classification) and/or unsupervised (e.g., pattern analysis) manner. Deep neural networks include a hierarchy of layers, where the different layers learn different levels of representations that correspond to different levels of abstraction. In deep learning, each level learns to transform its input data into a slightly more abstract and composite representation. In an image recognition application, for example, the raw input may be a matrix of pixels; the first representational layer may abstract the pixels and encode edges; the second layer may compose and encode arrangements of edges; the third layer may encode higher level shapes (e.g., teeth, lips, gums, etc.); and the fourth layer may recognize that the image contains a face or define a bounding box around teeth in the image. Notably, a deep learning process can learn which features to optimally place in which level on its own. The "deep" in "deep learning" refers to the number of layers through which the data is transformed. More precisely, deep learning systems have a substantial credit assignment path (CAP) depth. The CAP is the chain of transformations from input to output. CAPs describe potentially causal connections between input and output. For a feedforward neural network, the depth of the CAPs may be that of the network and may be the number of hidden layers plus one. For recurrent neural networks, in which a signal may propagate through a layer more than once, the CAP depth is potentially unlimited.

In one embodiment, the machine learning model is a recurrent neural network (RNN). An RNN is a type of neural network that includes a memory to enable the neural network to capture temporal dependencies. An RNN is able to learn input-output mappings that depend on both a current input and past inputs. The RNN will address sensor data taken from a current and past measurement cycles and make predictions based on this continuous information. RNNs may be trained using a training dataset to generate a fixed number of outputs (e.g., to classify time varying data such as OES sensor data taken over time). One type of RNN that may be used is a long short term memory (LSTM) neural network.

Upon the computing system determining that the sensor data satisfies one or more sensor data criteria, the measurement cycle is concluded, and method 200 continues by the computing system analyzing the sensor data the meets the sensor data criteria to determine whether a vacuum chamber is leak tight and/or a vacuum chamber leak rate (290). If a vacuum leak is present in the vacuum chamber, the sensor data will stabilize at an elevated level (e.g., above sensor data value threshold). If the vacuum chamber is leak tight, the sensor data will stabilize at a level that is below the sensor data value threshold.

The leak rate for leak of various degrees can be calibrated in a controlled manner for each chamber. In this manner, a particular vacuum chamber's health may be fingerprinted. In other words, each vacuum chamber may be associated with baseline sensor data characteristic for a leak tight vacuum chamber and for leaks of varying leak rates. For example, sensor data may be attained during a one-time service routine when the chamber is leak tight to fingerprint a baseline sensor data for a leak tight vacuum chamber. Similar one-time measurements may be done on calibrated leaks (e.g., a 0.3 mTorr/min leak to about 20 mTorr/min leak) a with a controlled or known leak rate. The sensor data that meets the sensor date criteria (in block 250) may be compared (e.g., during analysis operation 290) to the baseline sensor data.

In one embodiment, a trained machine learning model is used to determine a current leak rate of the chamber based on the sensor data that satisfied the one or more sensor criteria. The trained machine learning model may be of any of the types of machine learning models discussed hereinabove. The trained machine learning model may have been trained to receive sensor data as an input and to output a leak rate value. The trained machine learning model may have been trained using a training dataset that included sensor data labeled with leak rates. The training dataset may have been generate from the data collected from the same chamber that is under test, from the same class of chamber, or from other types of chambers. In one embodiment, a single trained machine learning model outputs a first value indicating whether the sensor data satisfies one or more sensor data criteria and further outputs a second value indicating a leak rate. Thus, in embodiments operations at block 250 and block 290 may be performed concurrently by inputting the sensor data into the trained machine learning model.

FIGS. 3A and 3B are examples of using the operational method 200 of FIG. 2. FIG. 3A illustrates a graphical output of an operational method 200, for determining vacuum chamber leak integrity, performed on a vacuum chamber with a leak, according to embodiments of the disclosure. FIG. 3B illustrates a graphical output of an operational method 200, for determining vacuum chamber leak integrity, performed on a vacuum chamber without a leak, according to embodiments of the disclosure.

In both FIGS. 3A and 3B, the sensor data received by the computing system from the optical emission sensor is a purity number for oxygen at 777 nm. The purity number of oxygen (at 777 nm) as a function of time (in seconds) is shown by line 310 in FIG. 3A and 350 in FIG. 3B. Lines 320 and 360 represent actual pressure change as a function of time (in seconds) in the process chamber during purity measurements. This change is equal to a pressure increase (e.g., in Torr) from vacuum leaks plus a pressure change from chamber outgassing (virtual leaks). With reference to FIG. 3A, six measurement cycles, designated as A, B, C, D, E, and F were performed until the computing system determined that the sensor data it received from the optical emission sensor (purity number) met the sensor data criteria. In each cycle, the pressure was pumped down for a first duration, the chamber was isolated, and thereafter the optical emission sensor generated information about the rate of pressure rise of oxygen (at 777 nm) in the vacuum chamber. The rate of pressure rise was correlated to a purity number, shown by line 310. For example, cycle C had a purity number of about 17, cycle D had a purity number of about 11, cycle E had a purity number of about 12.

The computing system may receive sensor data criteria such as a difference threshold, a measurement cycle number threshold, and a sensor data value threshold. In FIG. 3A, the difference threshold may be, for example, 1% variation, the measurement cycle number threshold may be, for example, 3 cycles, and the sensor data value threshold may be, for example, a purity number of 0.

For example, in cycle C, the computing system may analyze whether the difference between first sensor data from cycle C (i.e., purity number of cycle C) and the sensor data from one or more previous cycles (i.e., purity numbers of cycle A and B) is less than the difference threshold (i.e., less than 1% variation) for a number of measurement cycles that at least equals the measurement cycle number threshold (i.e., 3 cycles). If the purity number of cycle C, when compared to the purity numbers of cycles A and B, is less than the specified difference threshold for 3 cycles in a row, the measurement cycle will end and the computing system may analyze the purity number of cycle C to determine the vacuum chamber's leak rate.

Alternatively, the computing system may analyze whether the sensor data (i.e., purity number) of measurement cycles that at least equals the measurement cycle number threshold (i.e., 3 cycles) is below the sensor data value threshold (i.e., a purity number of below 0). If the purity number of three cycles in a row (e.g., cycle C, D, and E) is less than the specified sensor data value threshold of a purity number of 0, the measurement cycle will end and the computing system may analyze the purity number of the last cycle that meets the sensor data criteria to determine the vacuum chamber's leak rate.

In FIG. 3A, the purity numbers of cycles D, E, and F were stable, so the computing system ended repetition of the measurement cycles after cycle F (i.e., within about 600 seconds or about 10 minutes). The purity number of cycle F was analyzed by the computing system and the vacuum chamber was determined to have a leak.

With reference to FIG. 3B, eleven measurement cycles, designated as 1, 2, 3, 4, 5, 6, 7, 8, 9, 10, and 11 were performed until the computing system determined that the sensor data it received from the optical emission sensor (purity number) met the sensor data criteria following a similar operational method as described in FIG. 2 and exemplified in FIG. 3A. In FIG. 3B, the purity number of cycles 9, 10, and 11 were stable (i.e., the difference in purity number of these cycles was below the difference threshold), so the computing system ended repetition of the measurements cycles after cycle 11 (within about 1200 seconds or about 20 minutes). The purity number of cycle 11 was analyzed by the computing system and the vacuum chamber was determined to not have a leak.

The sensor data received by the computing system in the scenarios exemplified in FIGS. 3A and 3B was for oxygen. However, the computing system may receive similar sensor data for one or more other gases instead or in addition to oxygen (such as nitrogen, argon, hydrogen, or hydroxyl). FIG. 4A illustrates a graphical output of purity number as a function of purity measurement cycle for oxygen (measured at 777 nm wavelength) and nitrogen (measured at 870 nm wavelength), attained upon performing an operational method for determining vacuum chamber leak integrity on a vacuum chamber, according to embodiments of the disclosure.

FIG. 4A also illustrates that the sensor data received from the optical emission sensor for one or more gases is reliable and reproducible. For instance, the trend of the purity number as a function of purity cycle for oxygen (as measured at 777 nm) and for nitrogen (as measured at 870 nm) remained consistent across four separate runs. This observation was further supported by FIG. 4B.

Figure 4B:
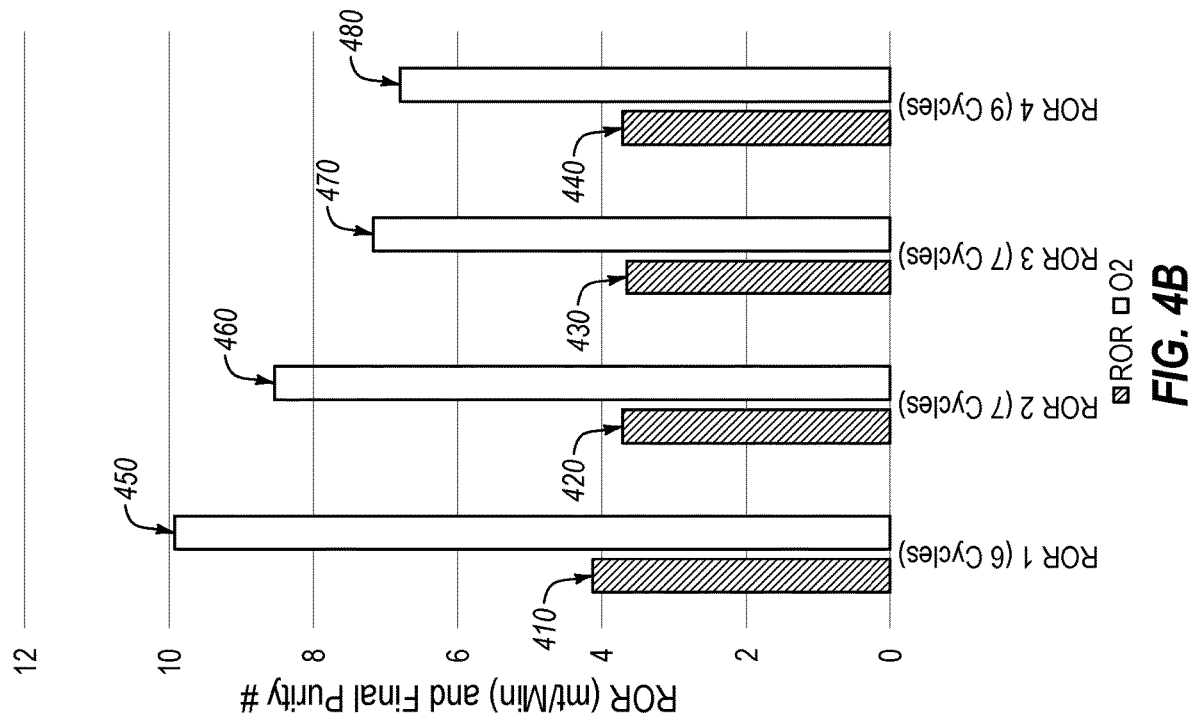
FIG. 4B illustrates consistency of four rate of rise values, attained upon performing an operational method for determining vacuum chamber leak integrity on a vacuum chamber, according to embodiments of the disclosure.
Figure 4A:
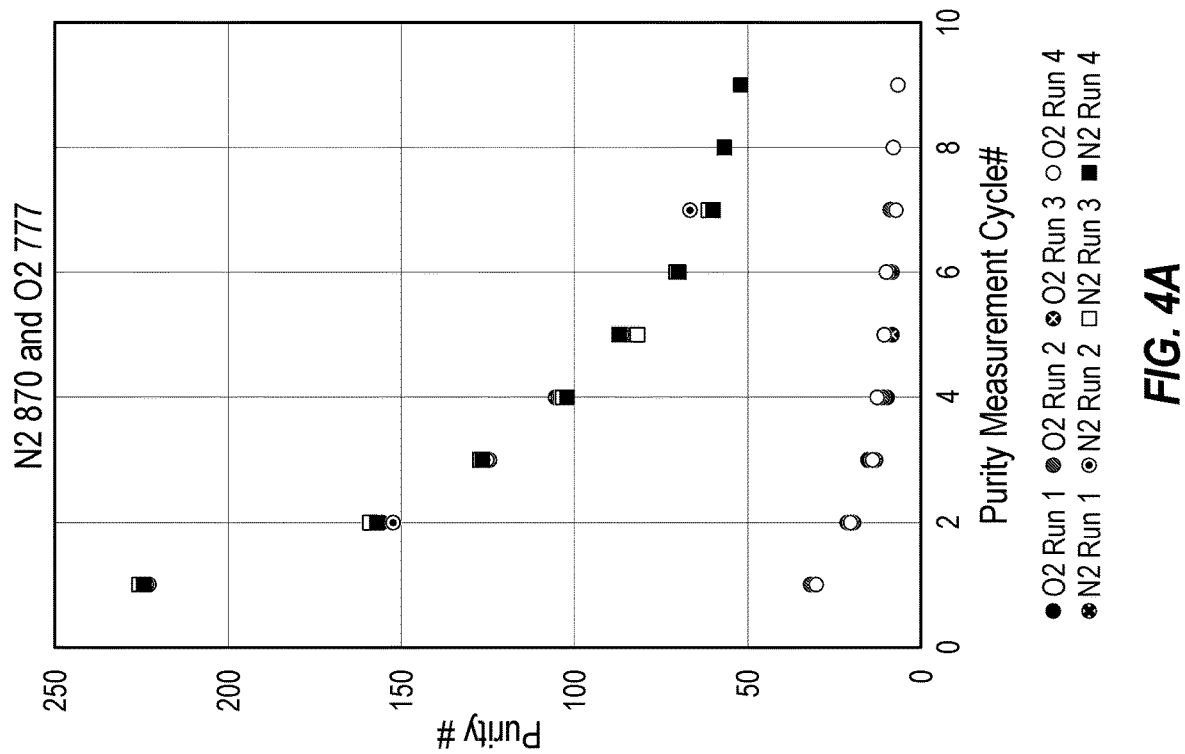
FIG. 4A illustrates a graphical output of purity number as a function of purity measurement cycle for oxygen and nitrogen, attained upon performing an operational method for determining vacuum chamber leak integrity on a vacuum chamber, according to embodiments of the disclosure.

In FIG. 4B, the rate of pressure rise of oxygen is depicted by bars 410, 420, 430, and 440 and the final purity number of oxygen at the last measurement cycle of each run is depicted by bars 450, 460, 470, and 480. The first run included six measurement cycles until the computing system determined that the sensor data (i.e., purity number of oxygen and/or of nitrogen) satisfied the one or more sensor data criteria. The second run included seven measurement cycles, the third run included seven measurement cycles, and the fourth run included nine measurement cycles. As can be seen in FIG. 4B, the rate of pressure rise of oxygen remained consistent across the four different runs. Similarly the final purity number for oxygen also did not deviate significantly across the four different runs. This illustrated the consistency and reliability of operational method 200 in determining vacuum chamber leak integrity.

Figure 5:
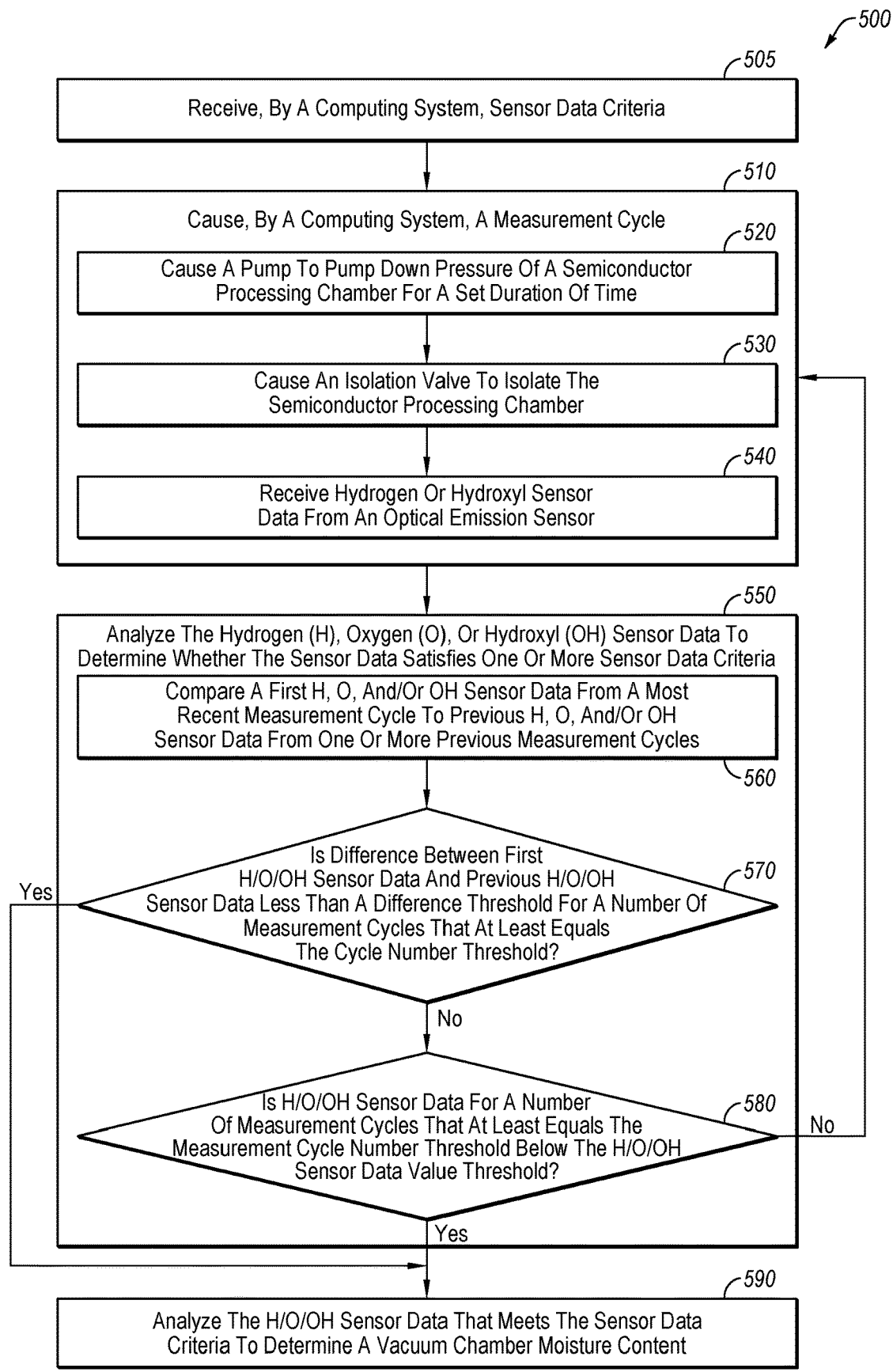
FIG. 5 illustrates a flow chart of an operational method of a computing system to determine vacuum chamber moisture content, according embodiments of the disclosure.

FIG. 5 is a flow chart of an operational method 500 for determining vacuum chamber moisture content of a processing chamber such as processing chamber 102 of FIG. 1, according to embodiments of the disclosure. Some operations of method 500 may be performed by processing logic that may include hardware (circuitry, dedicated logic, etc.), software (such as is run on a general purpose computer system or a dedicated machine), firmware, or some combination thereof. Some operations of method 500 may be performed by a computing system, such as the controller 155 of FIG. 1, that is in control of various components of processing chamber 102, such as pump 122, isolation valve 135, and/or optical emission sensor 158. For example, processing logic that performs one or more operations of method 500 may execute on the controller (e.g., computing system) 155.

For simplicity of explanation, the methods are depicted and described as a series of acts. However, acts in accordance with this disclosure can occur in various orders and/or concurrently, and with other acts not presented and described herein. Furthermore, not all illustrated acts may be performed to implement the methods in accordance with the disclosed subject matter. In addition, those skilled in the art will understand and appreciate that the methods could alternatively be represented as a series of interrelated states via a state diagram or events.

With reference to FIG. 5, the method 500 may begin with the computing system receiving sensor data criteria (505). Exemplary sensor data criteria that may be received by the computing system includes at least one of a difference threshold, a measurement cycle number threshold, and a sensor data value threshold. Each of these sensor data criteria will be described in further detail below with reference to various operations of method 500.

The method 500 may continue with the computing system causing a measurement cycle to occur (510). In each measurement cycle, the computing system causes a pump (such as pump 122 in FIG. 1) to pump down the pressure of a vacuum chamber (such as semiconductor processing chamber 102 in FIG. 1) for a set duration of time (520) and/or to a target pressure (e.g., of about 0.1 mTorr to about 500 mTorr, or greater than 10 mTorr). Unlike with existing methods, where operators may pump down the pressure of the vacuum chamber for an extended duration that can sometimes take hours (e.g., until a certain pressure is achieved), the pumping operation of method 500 is short in duration and can span for a first duration ranging from about 10 seconds to about 10 minutes, from about 30 seconds to about 7 minutes, or from about 1 minute to about 5 minutes.

The method 500, and particularly the measurement cycle, continues with the computing system causing an isolation valve (such as isolation valve 135 in FIG. 1) to isolate the internal cavity (e.g., 106 in FIG. 1) of the vacuum chamber (530). The isolation operation of method 500 is also short in duration and can span for a second duration ranging from about 10 seconds to about 3 minutes, from about 20 seconds to about 2 minutes, or from about 30 seconds to about 90 seconds.

The method 500, and particularly the measurement cycle, continues with the computing system receiving hydrogen (H), oxygen (O), or hydroxyl (OH) sensor data from an optical emission sensor (e.g., remote plasma optical emission sensor 158 in FIG. 1) (540). The H, O, or OH sensor data that is received from the optical emission sensor correlates to the rate of pressure rise in the vacuum chamber (e.g., in the semiconductor processing chamber) and can provide information about the vacuum chamber's moisture content.

The H, O, and/or OH sensor data that is received from the optical emission sensor may include at least one of vacuum chamber pressure (e.g., semiconductor processing chamber pressure), OES line intensity in counts per second (CPS) or arbitrary units (AU) of H, O, and/or OH in the vacuum chamber (e.g., in the semiconductor processing chamber), ratios of H, O and OH, composition of atmosphere in the vacuum chamber (e.g., in the semiconductor processing chamber), a purity number for H, O, and/or OH in the vacuum chamber (e.g., in the semiconductor processing chamber), optical sensor integration time for H, O, and/or OH in the vacuum chamber (e.g., in the semiconductor processing chamber), rate of pressure rise of H, O, and/or OH in the vacuum chamber (e.g., in the semiconductor processing chamber), optical emissions measurements for H, O, and/or OH, or a combination thereof. The optical emission sensor may provide sensor data for H, O, and/or OH at varying wavelength, such as, from about 200 nm wavelength to about 900 nm wavelength.

The sensor data that is received by the computing system from the optical emission sensor may take different forms, as was explained in further detail above with respect to FIG. 2.

The method 500, and particularly the measurement cycle, continues by the computing system analyzing the H, O, and/or OH sensor data to determine whether the H, O, and/or OH sensor data satisfies one or more sensor data criteria (550). This determination may occur by the computing system comparing a first H, O, and/or OH sensor data from a most recent measurement cycle to a previous H, O, and/or OH sensor data from one or more previous measurement cycles (560).

If method 500, as part of the measurement cycle, determines that the difference between the first H, O, and/or OH sensor data and previous H, O and/or OH sensor data from one or more previous measurement cycles is less than a difference threshold for a number of measurement cycles that at least equals the measurement cycle number threshold (570), the method 500 determines that the sensor data has stabilized, may end repetition of the measurement cycles, and continue to the next operation (590). Determination that the sensor data has stabilized indicates that the background level of H, O, and/or OH is not changing.

If, however, method 500, as part of the measurement cycle, determines that the difference between the first H, O, and/or OH sensor data and the previous data is higher than the difference threshold or is less than a difference threshold for a number of measurement cycles that is lower than the measurement cycle number threshold, the method 500 may continue to operation 580 to determine whether the H, O, and/or OH sensor data satisfies one or more sensor data criteria from a different aspect.

If method 500, as part of the measurement cycle, determines that the H, O, and/or OH sensor data for a number of measurement cycles that at least equals the measurement cycle number threshold has been below the H, O, and/or OH sensor data value threshold (580), the method 500 may end repetition of the measurement cycles and continue to the next operation (590). If, however, method 500, as part of the measurement cycle, determines that the difference between the first H, O, and/or OH sensor data and the previous H, O, and/or OH sensor data is higher than the H, O, and/or OH sensor data value threshold or is below the H, O, and/or OH sensor data value threshold for number of measurement cycles that is lower than the measurement cycle number threshold, the method 500 may repeat the measurement cycle (e.g., operations 510, 520, 530, 540, 550, 560, 570, and 580).

In one embodiment, a trained machine learning model is used to determine whether the H, O, and/or OH sensor data meets the one or more sensor data criteria. The sensor data may be input into the trained machine learning model, which may then output a classification for the sensor data. The classification may be a first classification indicating that the one or more sensor data criteria are satisfied or a second classification indicating that the one or more sensor data criteria are not satisfied. In one embodiment, sensor data from multiple measurement cycles is input into the trained machine learning model. For example, sensor data from three measurement cycles may be input into the trained machine learning model.

The trained machine learning model may have been trained using a training dataset including a large number of data items, where each data item included a label indicating that the data item either did or did not satisfy the one or more sensor data criteria.

The trained machine learning model may be, for example, a decision tree, a neural network such as a convolutional neural network, a deep neural network, or other type of machine learning model. One type of machine learning model that may be used for determining whether the sensor data satisfies sensor data criteria is an artificial neural network, such as a deep neural network. Artificial neural networks generally include a feature representation component with a classifier or regression layers that map features to a target output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g. classification outputs). Deep learning is a class of machine learning algorithms that use a cascade of multiple layers of nonlinear processing units for feature extraction and transformation. Each successive layer uses the output from the previous layer as input.

Deep neural networks may learn in a supervised (e.g., classification) and/or unsupervised (e.g., pattern analysis) manner. Deep neural networks include a hierarchy of layers, where the different layers learn different levels of representations that correspond to different levels of abstraction. In deep learning, each level learns to transform its input data into a slightly more abstract and composite representation. In an image recognition application, for example, the raw input may be a matrix of pixels; the first representational layer may abstract the pixels and encode edges; the second layer may compose and encode arrangements of edges; the third layer may encode higher level shapes (e.g., teeth, lips, gums, etc.); and the fourth layer may recognize that the image contains a face or define a bounding box around teeth in the image. Notably, a deep learning process can learn which features to optimally place in which level on its own. The "deep" in "deep learning" refers to the number of layers through which the data is transformed. More precisely, deep learning systems have a substantial credit assignment path (CAP) depth. The CAP is the chain of transformations from input to output. CAPs describe potentially causal connections between input and output. For a feedforward neural network, the depth of the CAPs may be that of the network and may be the number of hidden layers plus one. For recurrent neural networks, in which a signal may propagate through a layer more than once, the CAP depth is potentially unlimited.

In one embodiment, the machine learning model is a recurrent neural network (RNN). An RNN is a type of neural network that includes a memory to enable the neural network to capture temporal dependencies. An RNN is able to learn input-output mappings that depend on both a current input and past inputs. The RNN will address sensor data taken from a current and past measurement cycles and make predictions based on this continuous information. RNNs may be trained using a training dataset to generate a fixed number of outputs (e.g., to classify time varying data such as OES sensor data taken over time). One type of RNN that may be used is a long short term memory (LSTM) neural network.

Upon the computing system determining that the H, O and/or OH sensor data satisfies one or more sensor data criteria, the measurement cycle is concluded, and method 500 continues by the computing system analyzing the H, O and/or OH sensor data that meets the sensor data criteria to determine a vacuum chamber moisture content (590).

The moisture level can be calibrated in a controlled manner for each chamber. In this manner, a particular vacuum chamber's moisture saturation may be fingerprinted. In other words, each vacuum chamber may be associated with baseline moisture sensor data characteristic for varying moisture levels. For example, sensor data, indicative of the moisture content in a chamber, may be attained upon injecting into the chamber a variety of known water amounts (e.g., 1 cc, 3 cc, 5 cc, 7 cc, 10 cc, and so on) to generate a baseline moisture sensor data. The sensor data that meets the sensor date criteria (in block 550) may be compared (e.g., during analysis operation 590) to the baseline moisture sensor data to determine moisture content in the chamber during pump down and bake out chamber operations. A calibrated reference device (such as Tiger Optics® H2O calibrated reference device) may also be used to calibrate a signal from a purity gauge.

In one embodiment, a trained machine learning model is used to determine a current moisture content in the chamber based on the O, H, and/or OH sensor data that satisfied the one or more sensor criteria. The trained machine learning model may be of any of the types of machine learning models discussed hereinabove. The trained machine learning model may have been trained to receive O, H, and/or OH sensor data as an input and to output a moisture content value. The trained machine learning model may have been trained using a training dataset that included O, H, and/or OH sensor data labeled with moisture levels. The training dataset may have been generate from the data collected from the same chamber that is under test, from the same class of chamber, or from other types of chambers. In one embodiment, a single trained machine learning model outputs a first value indicating whether the H, O, and/or OH sensor data satisfies one or more sensor data criteria and further outputs a second value indicating a moisture content. Thus, in embodiments operations at block 550 and block 590 may be performed concurrently by inputting the H, O, and/or OH sensor data into the trained machine learning model.

Figure 6A:
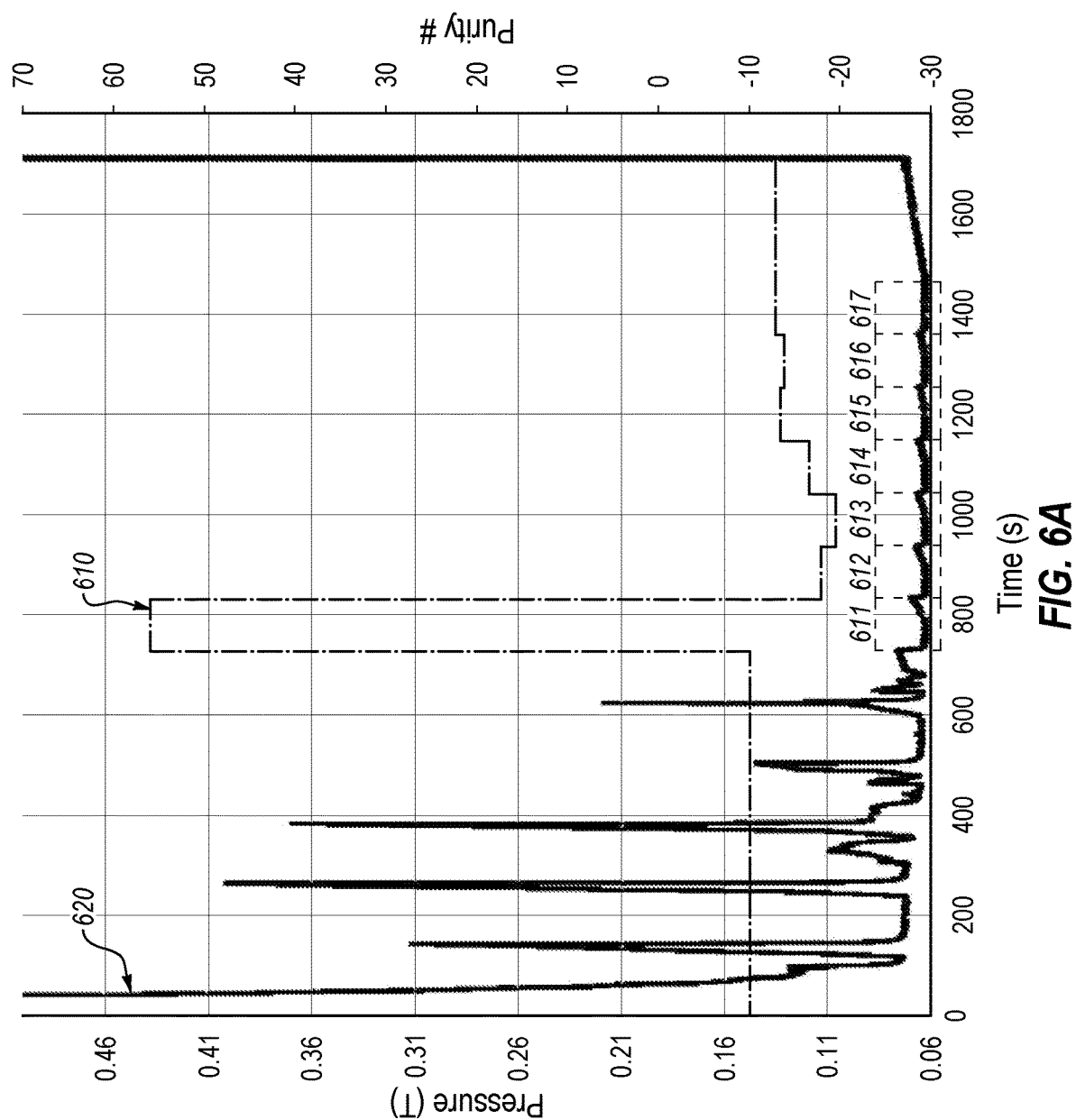
FIG. 6A illustrates a graphical output of an operational method, for determining vacuum chamber moisture content, performed on a vacuum chamber without a leak, according to embodiments of the disclosure.
Figure 6B:
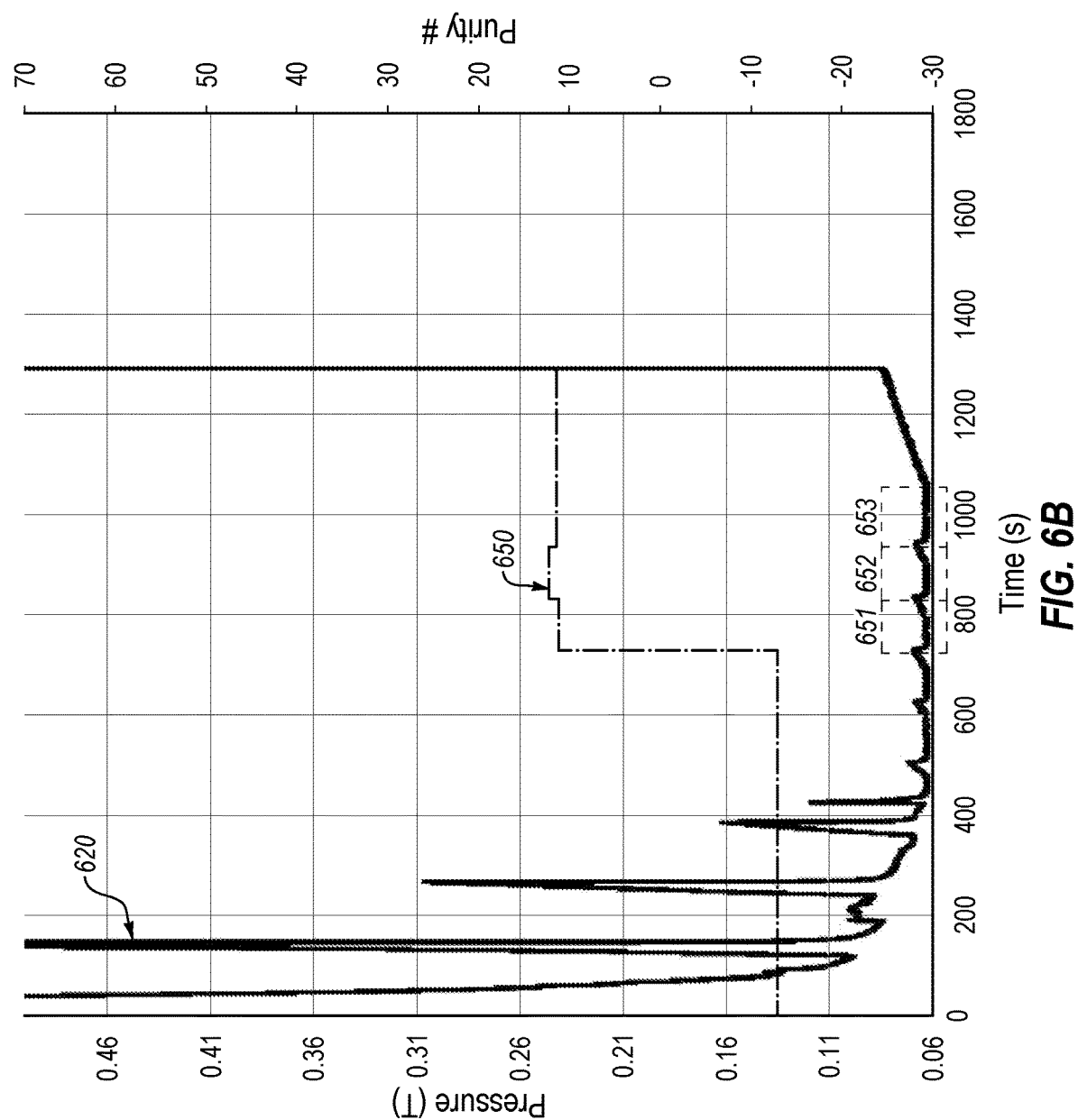
FIG. 6B illustrates a graphical output of an operational method, for determining vacuum chamber moisture content, performed on a vacuum chamber with a leak, according to embodiments of the disclosure.

FIGS. 6A and 6B are examples of using the operational method 500 of FIG. 5. FIG. 6A illustrates a graphical output of the operational method 500, for determining vacuum chamber moisture content, performed on a vacuum chamber without a leak, according to embodiments of the disclosure.

FIG. 6B illustrates a graphical output of the operational method 500, for determining vacuum chamber moisture content, performed on a vacuum chamber with a leak, according to embodiments of the disclosure.

In both FIGS. 6A and 6B, the sensor data received by the computing system from the optical emission sensor is a purity number for oxygen at 777 nm. The purity number of oxygen (at 777 nm) as a function of time (in seconds) is shown by line 610 in FIG. 6A and 650 in FIG. 6B. The partial pressure of oxygen in the vacuum chamber (in Torr) as a function of time (in seconds) is depicted with line 620 in FIG. 6A and with line 660 in FIG. 6B. Prior to obtaining the sensor data depicted in FIGS. 6A and 6B, the chambers were injected with 10 cc of water. The sensor data of FIGS. 6A and 6B exemplify use of operational method 500 to determine moisture content in a vacuum chamber.

With reference to FIG. 6A, seven measurement cycles, designated as 611, 612, 613, 614, 615, 616, and 617 were performed until the computing system determined that the O sensor data it received from the optical emission sensor (purity number) met the sensor data criteria. In each cycle, the pressure was pumped down for a first duration, the chamber was isolated, and thereafter the optical emission sensor generated information about the rate of pressure rise of oxygen (at 777 nm) in the vacuum chamber. For example, the rate of pressure rise of oxygen could be attained from the slope of line 620 in the portions that line 620 increases in each one of cycles 611 through 617. The rate of pressure rise was correlated to a purity number, shown by line 610. For example, cycle 611 had a purity number of about 55, cycle 613 had a purity number of about −20, cycle 616 had a purity number of about −15.

The computing system may receive sensor data criteria such as a difference threshold, a measurement cycle number threshold, and a sensor data value threshold. In FIG. 6A, the difference threshold may be, for example, 1% variation, the measurement cycle number threshold may be, for example, 3 cycles, and the sensor data value threshold may be, for example, a purity number of −10.

For example, in cycle 615, the computing system may analyze whether the difference between first O sensor data from cycle 615 (i.e., purity number of cycle 615) and the sensor data from one or more previous cycles (i.e., purity numbers of one or more of cycles 611-614) is less than the difference threshold (i.e., less than 1% variation) for a number of measurement cycles (in a row) that at least equals the measurement cycle number threshold (i.e., 3 cycles). If the purity number of cycle 615, when compared to the purity numbers of each one of cycles 611-614, is less than the specified difference threshold for three cycles in a row, the measurement cycle will end and the computing system may analyze the purity number of cycle 615 to determine the vacuum chamber's moisture content.

Alternatively, the computing system may analyze whether the H, O and/or OH sensor data (i.e., purity number) of measurement cycles that at least equals the measurement cycle number threshold (i.e., 3 cycles) is below the H, O, and/or OH sensor data value threshold (i.e., a purity number of below −10). If the purity number of three cycles in a row (e.g., cycle 613, 614, and 615) is less than the specified H, O, and/or OH sensor data value threshold of a purity number of −10, the measurement cycle will end and the computing system may analyze the purity number of the last cycle that meets the sensor data criteria to determine the vacuum chamber's moisture content.

In FIG. 6A, the purity numbers of cycles 615, 616, and 617 were stable, so the computing system ended repetition of the measurement cycles after cycle 617 (i.e., within about 1500 seconds or about 25 minutes). The purity number of cycle 617 was analyzed by the computing system and the vacuum chamber was determined to not have a water leak.

With reference to FIG. 6B, three measurement cycles, designated as 651, 652, and 653 were performed until the computing system determined that the O sensor data it received from the optical emission sensor ($O_{777}$ purity number) met the sensor data criteria following a similar operational method as described in FIG. 5 and exemplified in FIG. 6A. In FIG. 6B, the purity number of cycles 651, 652, and 653 were stable (i.e., the difference in purity number of these cycles was below the difference threshold), so the computing system ended repetition of the measurements cycles after cycle 653 (within about 1000 seconds or less than about 20 minutes). The purity number of cycle 653 was analyzed by the computing system and the vacuum chamber was determined to have a water leak.

The sensor data received by the computing system in the scenarios exemplified in FIGS. 6A and 6B was for oxygen at a wavelength of 777 nm. However, the computing system may receive similar sensor data for one or more other gases instead or in addition to oxygen at that wavelength (such as oxygen at a different wavelength, hydrogen, or hydroxyl).

Figure 7A:
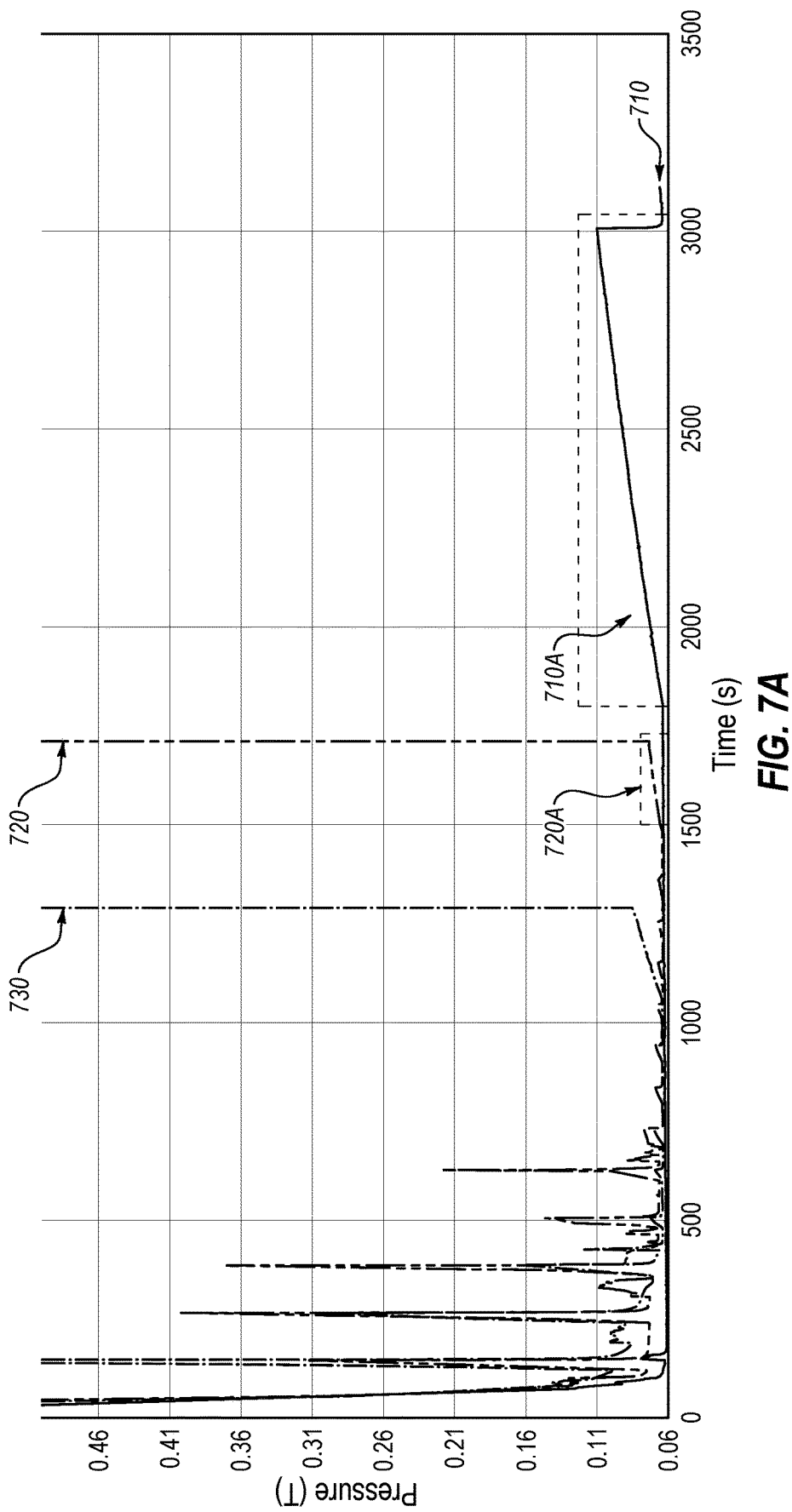
FIG. 7A illustrates a comparison of the graphical output of an operational method according to embodiments of the disclosure as compared to the graphical output of an operational method according to the state of the art.
Figure 7B:
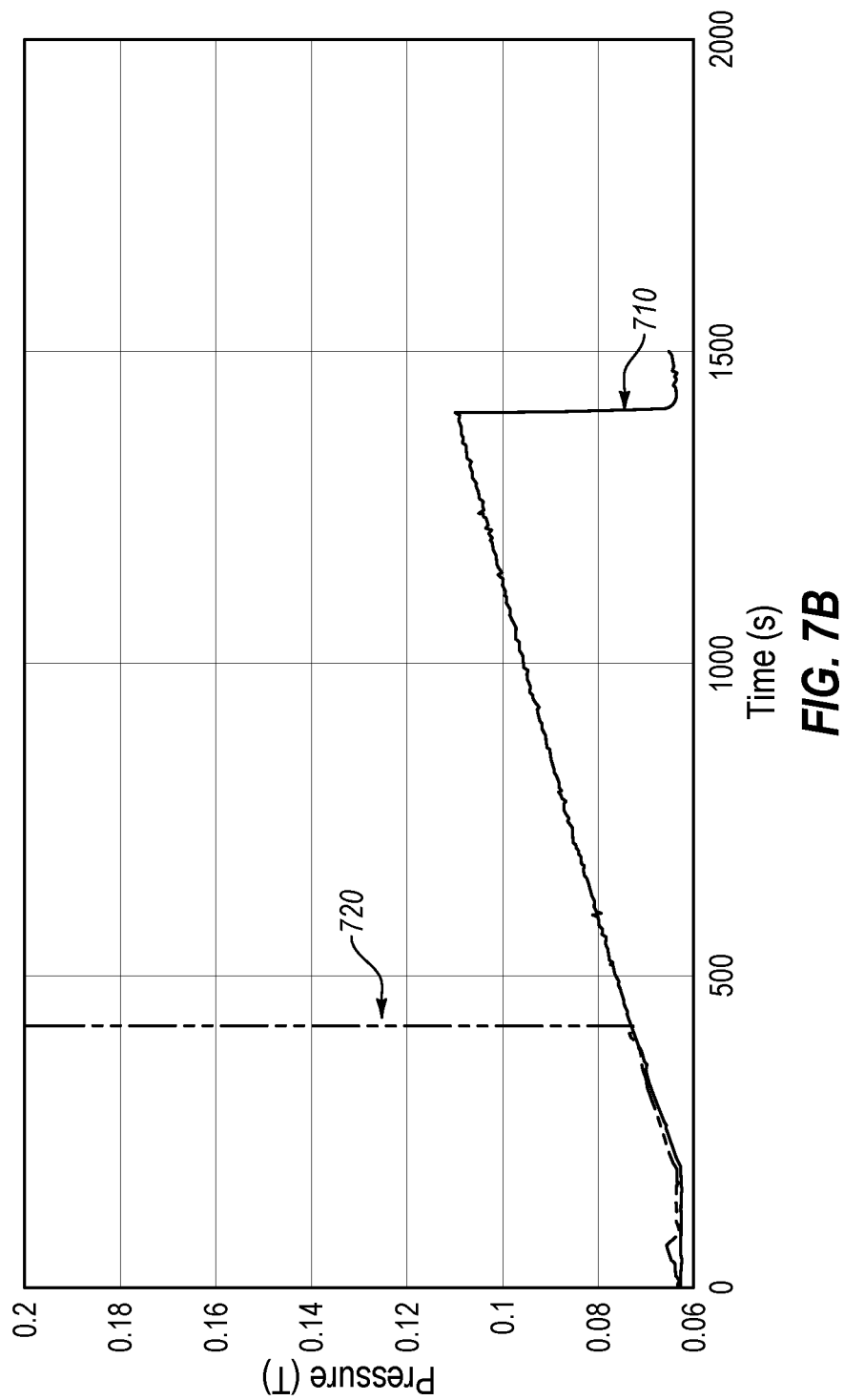
FIG. 7B is a close up overlay of sections 710A and 720A from FIG. 7A.

The operational methods described herein (e.g., method 200 and method 500), provide in-situ and rapid feedback about the vacuum leak integrity and/or moisture content of the vacuum chamber after maintenance and/or after venting. As can be seen in FIGS. 7A and 7B, the operational methods described herein provide the same rate of pressure rise information (and correspondingly the same vacuum chamber leak integrity and/or moisture content) as existing operational methods provide in a fraction of the time.

FIG. 7A illustrates a comparison of the rate of pressure rise determination using an operational method according to embodiments of the disclosure as compared to the rate of pressure rise determination using an operational method according to the state of the art.

Line 710 is a graphical output of the chamber pressure (in Torr) as a function of time (in seconds) when using an operational method according to the state of the art. With operational methods according to the state of the art, the rate of pressure rise was determined after about 3000 seconds (or about 50 minutes).

Line 720 is a graphical output of the chamber pressure (in Torr) as a function of time (in seconds) when using an operation method according to embodiments described herein. With operational methods according to embodiments described herein, the rate of pressure rise was determined after about 1700 seconds (or about 28 minutes), which is almost half the time that it took to determine the same information with an operational method according to the state of the art (evidenced by line 710 in FIG. 7A).

Line 730 is a graphical output of the chamber pressure (in Torr) as a function of time (in seconds) when using an operation method according to embodiments described herein. With operational methods according to embodiments described herein, the rate of pressure rise was determined after about 1300 seconds (or about 21 minutes), which is more than half the time that it took to determine the same information with an operational method according to the state of the art (evidenced by line 710 in FIG. 7A). In some embodiments, the rate of pressure rise may not be determined, which may reduce a total time for generating a measurement.

The difference between lines 720 and 730 is that line 720 was obtained from a vacuum chamber without a leak whereas line 730 was obtained from a vacuum chamber with a leak. Line 710 was obtained from a vacuum chamber without a leak.

Sections 720A of line 720 and 710A of line 710 were used in the operational method according to embodiments described herein and in the method according to the state of the art, respectively, to determine the rate of pressure rise in the vacuum chamber. The rate of pressure rise could be determined from the slopes of lines 710 and 720 in sections 710A and 720A. Sections 710A and 720A were overlapped in FIG. 7B to show that both methods provide the same rate of pressure rise determination. The operational methods described herein provide the same information as existing methods but does so in-situ, rapidly, reliably, and in a cost effective manner.

Figure 8:
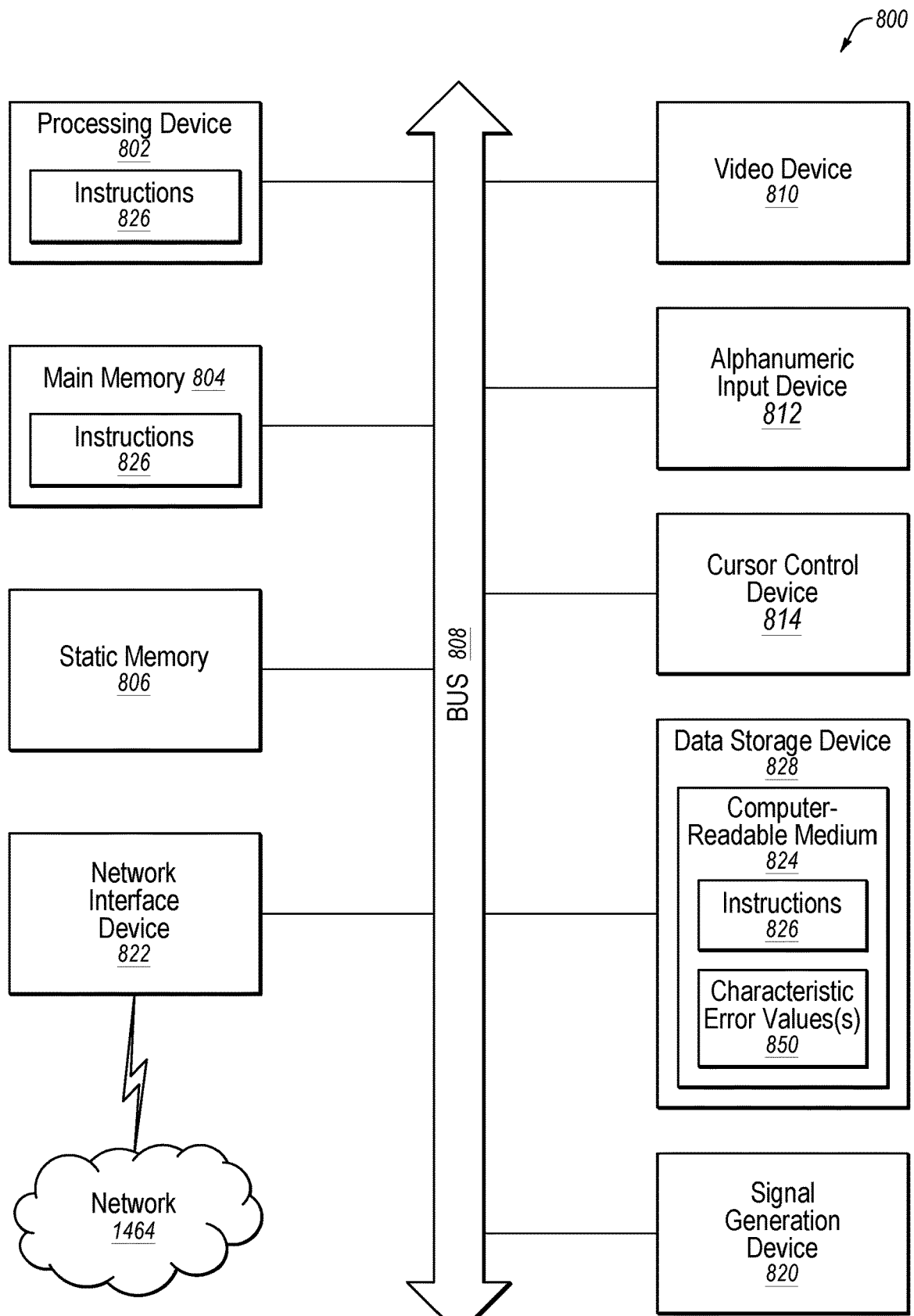
FIG. 8 is an example computing system that may operate as a controller for the system of FIG. 1, in accordance with embodiments of the present disclosure.

FIG. 8 is an example computing system 800 that may operate as a system controller for a processing system (such as controller (e.g., computing system) 155 in FIG. 1), in accordance with embodiments of the present disclosure. The computing system 800 is a machine within which a set of instructions, for causing the machine to perform any one or more of the methodologies discussed herein, may be executed. In alternative embodiments, the machine may be connected (e.g., networked) to other machines in a Local Area Network (LAN) 864, an intranet, an extranet, or the Internet. The machine may operate in the capacity of a server or a client machine in a client-server network environment, or as a peer machine in a peer-to-peer (or distributed) network environment. The machine may be a personal computer (PC), a tablet computer, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In an embodiment, computing device 800 corresponds to system controller 155 of FIG. 1. In one embodiment, system controller 155 is a component of computing system 800.

The example computing system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory (e.g., a data storage device 1412), which communicate with each other via a bus 808.

Processing device 802 represents one or more general-purpose processors such as a microprocessor, central processing unit, or the like. More particularly, the processing device 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. Processing device 802 is configured to execute the processing logic (instructions 826) for performing the operations discussed herein. In one embodiment, system controller 155 corresponds to processing device 802.

In embodiments, processing device 802 executes instructions 826 to implement method 200 or method 500 in embodiments.

The computing device 800 may further include a network interface device 822. The computing system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), and a signal generation device 820 (e.g., a speaker).

The data storage device 828 may include a machine-readable storage medium (or more specifically a computer-readable storage medium) 824 on which is stored one or more sets of instructions 826 embodying any one or more of the methodologies or functions described herein. The instructions 826 may also reside, completely or at least partially, within the main memory 804 and/or within the processing device 802 during execution thereof by the computing system 800, the main memory 804 and the processing device 802 also constituting computer-readable storage media.

The computer-readable storage medium 824 may also be used to store instructions 826 and/or characteristic error values 850 useful for analyzing sensor data in determining vacuum chamber leak integrity and/or moisture content and/or rate of pressure rise of a vacuum chamber 102. While the computer-readable storage medium 824 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium other than a carrier wave that is capable of storing or encoding a set of instructions for execution by the machine and that cause the machine to perform any one or more of the methodologies described herein. The term "computer-readable storage medium" shall accordingly be taken to include, but not be limited to, the non-transitory media including solid-state memories, and optical and magnetic media.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. In one embodiment, multiple metal bonding operations are performed as a single step.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method for verifying vacuum chamber leak integrity, the method comprising:
   causing, by a computing system, a measurement cycle comprising:
   causing a pump to pump down pressure of a semiconductor processing chamber for a set duration of time, independent of a target pressure;
   responsive to completion of the set duration of time, causing an isolation valve to isolate the semiconductor processing chamber;
   receiving sensor data from an optical emission sensor; and
   analyzing the sensor data to determine whether the sensor data satisfies one or more sensor data criteria;
   causing, by the computing system, one or more repetitions of the measurement cycle until the sensor data meets the one or more sensor data criteria; and
   analyzing the sensor data that meets the sensor data criteria to determine a vacuum chamber leak rate.

2. The method of claim 1, wherein the analyzing of the sensor data comprises determining a stability of the sensor data across a plurality of measurement cycles by:
   comparing first sensor data from a most recent measurement cycle to previous sensor data from one or more previous measurement cycles; and
   determining whether a difference between the first sensor data and the previous sensor data is less than a difference threshold.

3. The method of claim 2, wherein the sensor data criteria comprise the difference threshold, a sensor data value threshold, and a measurement cycle number threshold, and wherein the sensor data meets the one or more sensor data criteria if a) the difference between the first sensor data and the previous sensor data is less than the difference threshold for a number of measurement cycles that at least equals the measurement cycle number threshold, or b) the sensor data for a number of measurement cycles that at least equals the measurement cycle number threshold is below the sensor data value threshold.

4. The method of claim 3, wherein the sensor data value threshold comprises at least one of a purity number threshold, a rate of pressure rise threshold, or an optical sensor integration time threshold, as measured for one or more gases.

5. The method of claim 4, wherein the one or more gases are selected from nitrogen, oxygen, hydrogen, argon, or hydroxyl.

6. The method of claim 1, wherein the sensor data received from the optical emission sensor comprises at least one of semiconductor processing chamber pressure, partial pressure of one or more gases, composition of atmosphere in the semiconductor processing chamber, purity number for one or more gases, optical sensor integration time for one or more gases, rate of pressure rise of one or more gases, optical emissions measurements, or a combination thereof.

7. The method of claim 1, wherein causing the pump to pump down pressure of the semiconductor processing chamber occurs for a first duration of about 1 minute to about 5 minutes.

8. The method of claim 1, wherein causing the isolation valve to isolate the semiconductor processing chamber occurs for a second duration of about 30 seconds to about 90 seconds.

9. The method of claim 1, wherein the sensor data correlates to rate of pressure rise in the semiconductor processing chamber.

10. A method for monitoring vacuum chamber moisture content, the method comprising:
    causing, by a computing system, a measurement cycle comprising:
        causing a pump to pump down pressure of a semiconductor processing chamber for a set duration of time, independent of a target pressure;
        responsive to completion of the set duration of time, causing an isolation valve to isolate the semiconductor processing chamber;
        receiving hydrogen, oxygen, or hydroxyl related sensor data from an optical emission sensor; and
        analyzing the hydrogen, oxygen, or hydroxyl sensor data to determine whether the hydrogen, oxygen, or hydroxyl sensor data satisfies one or more sensor data criteria;
    causing, by the computing system, one or more repetitions of the measurement cycle until the hydrogen, oxygen, or hydroxyl sensor data meets the one or more sensor data criteria; and
    analyzing the hydrogen, oxygen, or hydroxyl sensor data that meets the one or more sensor data criteria to determine vacuum chamber moisture content.

11. The method of claim 10, wherein the analyzing the hydrogen, oxygen, or hydroxyl sensor data comprises determining a stability of the hydrogen, oxygen, or hydroxyl sensor data across a plurality of measurement cycles by:
    comparing a first hydrogen, oxygen, or hydroxyl sensor data from a most recent measurement cycle to a previous hydrogen, oxygen, or hydroxyl sensor data from one or more previous measurement cycles; and
    determining whether a difference between the first hydrogen, oxygen, or hydroxyl sensor data and the previous hydrogen, oxygen, or hydroxyl sensor data is less than a difference threshold.

12. The method of claim 11, wherein the sensor data criteria comprise the difference threshold, a sensor data value threshold, and a measurement cycle number threshold, and wherein the hydrogen, oxygen, or hydroxyl sensor data meets the one or more sensor data criteria if a) the difference between the first hydrogen, oxygen, or hydroxyl sensor data and the previous hydrogen, oxygen, or hydroxyl sensor data is less than the difference threshold for a number of measurement cycles that at least equals the measurement cycle number threshold, or b) the hydrogen, oxygen, or hydroxyl sensor data for a number of measurement cycles that at least equals the measurement cycle number threshold is below the sensor data value threshold.

13. The method of claim 10, wherein the sensor data value threshold comprises at least one of purity number threshold, rate of pressure rise threshold, or an optical sensor integration time threshold, as measured for hydrogen, oxygen, or hydroxyl.

14. The method of claim 10, wherein the hydrogen, oxygen, or hydroxyl sensor data received from the optical emission sensor comprises at least one of semiconductor processing chamber pressure, partial pressure of hydrogen, oxygen, or hydroxyl, composition of atmosphere in the semiconductor processing chamber, purity number for hydrogen, oxygen, or hydroxyl, optical sensor integration time for hydrogen, oxygen, or hydroxyl, optical emissions measurements for hydrogen, oxygen, or hydroxyl, rate of pressure rise of hydrogen, oxygen, or hydroxyl, or a combination thereof.

15. The method of claim 10, wherein causing the pump to pump down pressure of the semiconductor processing chamber occurs for a first duration of about 1 minute to about 5 minutes.

16. The method of claim 10, wherein causing the isolation valve to isolate the semiconductor processing chamber occurs for a second duration of about 30 seconds to about 90 seconds.

17. The method of claim 10, wherein the hydrogen, oxygen, or hydroxyl sensor data correlates to rate of pressure rise in the semiconductor processing chamber.

18. A system, comprising:
    a vacuum chamber comprising a body coupled to an isolation valve configured to isolate a cavity formed by the body;
    an optical emission sensor mounted onto the isolation valve, the optical emission sensor configured to generate sensor data corresponding to emission of one or more gases from the cavity;
    a pump coupled to the vacuum chamber, the pump configured to manipulate pressure in the vacuum chamber; and
    a computing system configured to:
        cause a measurement cycle comprising:
            cause the pump to pump down pressure of the vacuum chamber for a set duration of time, independent of a target pressure;
            responsive to completion of the set duration of time, cause the isolation valve to isolate the vacuum chamber;
            receive sensor data from the optical emission sensor;
            analyze the sensor data to determine whether the sensor data satisfies one or more sensor data criteria; and
        cause one or more repetitions of the measurement cycle until the sensor data meets the one or more sensor data criteria; and
        analyze the sensor data that meets the sensor data criteria to determine at least one of vacuum chamber leak rate or vacuum chamber moisture content.

19. The system of claim 18, wherein the sensor is a remote plasma optical emission sensor device.

20. The system of claim 18, wherein the pump is a rotary pump, a turbo pump, or a cryo pump.

* * * * *